(12) United States Patent
Hidaka

(10) Patent No.: US 6,970,377 B2
(45) Date of Patent: Nov. 29, 2005

(54) THIN FILM MAGNETIC MEMORY DEVICE FOR CONDUCTING DATA WRITE OPERATION BY APPLICATION OF A MAGNETIC FIELD

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/939,374

(22) Filed: Sep. 14, 2004

(65) Prior Publication Data

US 2005/0030829 A1 Feb. 10, 2005

Related U.S. Application Data

(63) Continuation of application No. 10/223,290, filed on Aug. 20, 2002, now Pat. No. 6,795,335.

(30) Foreign Application Priority Data

Oct. 25, 2001 (JP) .............................. 2001-327690
Mar. 14, 2002 (JP) .............................. 2002-070583

(51) Int. Cl.$^7$ .............................................. G11C 11/00
(52) U.S. Cl. ..................................... 365/158; 365/161
(58) Field of Search ................................ 365/161, 158

(56) References Cited

U.S. PATENT DOCUMENTS

| | | | |
|---|---|---|---|
| 3,456,247 A | 7/1969 | English | |
| 5,136,239 A | 8/1992 | Josephs | 324/210 |
| 6,349,054 B1 | 2/2002 | Hidaka | 365/173 |
| 6,404,671 B1 | 6/2002 | Reohr et al. | 365/158 |
| 6,646,911 B2 | 11/2003 | Hidaka | |
| 6,683,807 B2 * | 1/2004 | Hidaka | 365/161 |
| 6,788,568 B2 * | 9/2004 | Hidaka | 365/158 |

FOREIGN PATENT DOCUMENTS

| | | |
|---|---|---|
| DE | 1 524 770 | 5/1970 |
| DE | 100 53 965 A1 | 6/2002 |
| DE | 102 28 560 A1 | 5/2003 |

OTHER PUBLICATIONS

U.S. Appl. No. 09/887,321, filed Jun. 25, 2001, Hidaka.
Scheuerlein, et al, "A 10ns Read and Write Non-Volatile Memory Using a Magnetic Tunnel Junction and FET Switch in Each Cell" ISSCC Digest of Technical Papers, TA7.2, Feb. 2000, pp. 94-95, 128-129 and 409-410.
Durlam, et al, "Nonvolatile RAM Based on Magnetic Tunnel Junction Elements" ISSCC Digest of Technical Papers, TA7.3, Feb. 2000, pp. 96-97, 130-131 and 410-411.
Naji, et al, "A 256kb 3.0V 1T1MTJ Nonvolatile Magnetoresistive RAM" ISSCC Digest of Technical Papers, TA7.6, Feb. 2001, pp. 94-95, 122-123, 404-405 and 410.

(Continued)

Primary Examiner—Michael Tran
(74) Attorney, Agent, or Firm—McDermott Will & Emery LLP

(57) ABSTRACT

A peripheral circuitry is provided adjacent to a memory array and conducts read and write operations from and to the memory array. A power supply voltage line and a ground line for supplying an operating voltage to the peripheral circuitry supply a power supply voltage and a ground voltage, respectively. The power supply voltage line and the ground line are arranged so that a magnetic field generated by a current flowing through the power supply voltage line and a magnetic field generated by a current flowing through the ground line cancel each other in the memory array.

12 Claims, 26 Drawing Sheets

OTHER PUBLICATIONS

Scheuerlein, et al., "A 10 NS Read and Write Non-Volatile Memory Array Using a Magnetic Tunnel Junction and FET Switch in Each Cell", IEEE International Solid-State Circuits Conference, Feb. 7-9, 2000, 128-129.

Durlam et al., "Nonvolatile RAM Based on Magnetic Tunnel Junction Elements", IEEE International Solid-State Circuits Conference, Feb. 7-9, 2000, 130-131.

Naji et al., "A 256 KB 3.0 V 1T1MTJ Nonvolatile Magnetoresistive RAM" IEEE International Solid-State Circuits Conference, Feb. 5-7, 2001, 122-123, 438.

Petschauer, R. "Engineering Aspects of Magnetic Film Memories" IEEE Transactions on Magnetics, Bd. 1, Nr. 3, Sep. 1965, 185-192.

Wang et al. "Feasibility of Ultra-Dense Spin-Tunnelling Random Access Memory" IEEE Transactions on Magnetics, Bd. 33 Nr. 6, Nov. 1997, 4498-4512.

Brown et al., "One Megabit Memory Chip Using Giant Magnetoresistive Memory Cells" Nonvolatile Memory Technology Review, 1993, Jun. 22-24, 1993, 60-53.

* cited by examiner

THIN FILM MAGNETIC MEMORY DEVICE FOR CONDUCTING DATA WRITE OPERATION BY APPLICATION OF A MAGNETIC FIELD

This application is a continuation of application Ser. No. 10/223,290 filed Aug. 20, 2002 now U.S. Pat. No. 6,795,335.

BACKGROUND OF THE INVENTION

1. Field of the Invention

The present invention generally relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical-Papers, TA7.3, February 2000, and "A 256 kb 3.0V 1T1MTJ Nonvolatile Magnetoresistive RAM", ISSCC Digest of Technical Papers, TA7.6, February 2001.

FIG. 39 schematically shows the structure of a memory cell having a magnetic tunnel junction (hereinafter, sometimes simply referred to as "MTJ memory cell").

Referring to FIG. 39, the MTJ memory cell includes a tunneling magneto-resistance element TMR having an electric resistance varying according to the storage data level, and an access element ATR for forming a path of a sense current Is flowing through tunneling magneto-resistance element TMR in data read operation. Since a field effect transistor is typically used as access element ATR, access element ATR is hereinafter sometimes referred to as access transistor ATR. Access transistor ATR is coupled between tunneling magneto-resistance element TMR and a fixed voltage (ground voltage GND).

A write word line WWL for data write operation, a read word line RWL for data read operation, and a bit line BL are provided for the MTJ memory cell. Bit line BL serves as a data line for transmitting an electric signal corresponding to the storage data level in data read operation and data write operation.

FIG. 40 is a conceptual diagram illustrating data read operation from the MTJ memory cell.

Referring to FIG. 40, tunneling magneto-resistance element TMR has a ferromagnetic material layer FL having a fixed magnetization direction (hereinafter, sometimes simply referred to as "fixed magnetic layer"), a ferromagnetic material layer VL that is magnetized in the direction according to an external magnetic field (hereinafter, sometimes simply referred to as "free magnetic layer"), and an antiferromagnetic material layer AFL for fixing the magnetization direction of fixed magnetic layer FL. A tunneling barrier (tunneling film) TB of an insulator film is interposed between fixed magnetic layer FL and free magnetic layer VL. Free magnetic layer VL is magnetized either in the same (parallel) direction as, or in the opposite (antiparallel) direction to, that of fixed magnetic layer FL according to the write data level. Fixed magnetic layer FL, tunneling barrier TB and free magnetic layer VL form a magnetic tunnel junction.

In data read operation, access transistor ATR is turned ON in response to activation of read word line RWL. This allows a sense current Is to flow through a current path formed by bit line BL, tunneling magneto-resistance element TMR, access transistor ATR and ground voltage GND.

The electric resistance of tunneling magneto-resistance element TMR varies according to the relation between the magnetization directions of fixed magnetic layer FL and free magnetic layer VL. More specifically, when fixed magnetic layer FL and free magnetic layer VL have the same (parallel) magnetization direction, tunneling magneto-resistance element TMR has a smaller electric resistance than that of the case where they have opposite (antiparallel) magnetization directions.

Accordingly, when free magnetic layer VL is magnetized in the direction according to the storage data level, a voltage change produced on tunneling magneto-resistance element TMR by sense current Is varies depending on the storage data level. Therefore, by precharging bit lines BL to a prescribed voltage and then applying sense current Is to tunneling magneto-resistance element TMR, the storage data of the MTJ memory cell can be read by sensing the voltage on bit line BL.

FIG. 41 is a conceptual diagram illustrating data write operation to the MTJ memory cell.

Referring to FIG. 41, in data write operation, read word line RWL is inactivated and access transistor ATR is turned OFF. In this state, a data write current is applied to write word line WWL and bit line BL in order to magnetize free magnetic layer VL in the direction according to the write data level. The magnetization direction of free magnetic layer VL is determined by combination of the directions of the data write currents flowing through write word line WWL and bit line BL.

FIG. 42 is a conceptual diagram illustrating the relation between the data write current and the magnetization direction of the tunneling magneto-resistance element in data write operation to the MTJ memory cell.

Referring to FIG. 42, the abscissa H(EA) indicates a magnetic field that is applied to free magnetic layer VL of tunneling magneto-resistance element TMR in the easy-axis (EA) direction. The ordinate H(HA) indicates a magnetic field that is applied to free magnetic layer VL in the hard-axis (HA) direction. Magnetic fields H(EA), H(HA) respectively correspond to two magnetic fields produced by the currents flowing through bit line BL and write word line WWL.

In the MTJ memory cell, fixed magnetic layer FL is magnetized in the fixed direction along the easy axis of free magnetic layer VL. Free magnetic layer VL is magnetized either in the direction parallel or antiparallel (opposite) to that of fixed magnetic layer FL along the easy axis according to the storage data level ("1" and "0") Hereinafter, R1 and R0 (where R1>R0) denote the electric resistances of tunneling magneto-resistance element TMR corresponding to the two magnetization directions of free magnetic layer VL.

The MTJ memory cell is thus capable of storing 1-bit data ("1" and "0") according to the two magnetization directions of free magnetic layer VL.

The magnetization direction of free magnetic layer VL can be rewritten only when the sum of the applied magnetic fields H(EA) and H(HA) reaches the region outside the asteroid characteristic line in FIG. 42. In other words, the magnetization direction of free magnetic layer VL will not change if an applied data write magnetic field corresponds to the region inside the asteroid characteristic line.

As shown by the asteroid characteristic line, applying a magnetic field of the hard-axis direction to free magnetic layer VL enables reduction in magnetization threshold value required to change the magnetization direction along the easy axis.

When the write operation point is designed as in the example of FIG. 42, a data write magnetic field of the easy-axis direction is designed to have strength HWR in the MTJ memory cell to be written. In other words, a data write current to be applied to bit line BL or write word line WWL is designed to produce data write magnetic field HWR. Data write magnetic field HWR is commonly defined by the sum of a switching magnetic field HSW required to switch the magnetization direction and a margin ΔH. Data write magnetic field HWR is thus defined by HWR=HSW+ΔH.

In order to rewrite the storage data of the MTJ memory cell, that is, the magnetization direction of tunneling magneto-resistance element TMR, a data write current of at least a prescribed level must be applied to both write word line WWL and bit line BL. Free magnetic layer VL in tunneling magneto-resistance element TMR is thus magnetized in the direction parallel or antiparallel (opposite) to that of fixed magnetic layer FL according to the direction of the data write magnetic field along the easy axis (EA). The magnetization direction written to tunneling magneto-resistance element TMR, i.e., the storage data of the MTJ memory cell, is held in a non-volatile manner until another data write operation is conducted.

As described above, the electric resistance of tunneling magneto-resistance element TMR varies according to the magnetization direction that is rewritable by an applied data write magnetic field. Accordingly, non-volatile data storage can be realized by using the two magnetization directions of free magnetic layer VL in tunneling magneto-resistance element TMR as storage data levels ("1" and "0"), respectively.

When the MRAM device integrates such MTJ memory cells, the MTJ memory cells are commonly arranged in a matrix on a semiconductor substrate.

FIG. 43 is a conceptual diagram showing the array structure of the MTJ memory cells arranged in a matrix in an integrated manner.

In FIG. 43, the MTJ memory cells are arranged in n rows by m columns (where n, m is a natural number). As described before, bit line BL, write word line WWL and read word line RWL need be provided for each MTJ memory cell.

In data write operation, a prescribed data write current is applied to a write word line WWL and a bit line BL corresponding to the selected memory cell. For example, when the data is to be written to the shaded MTJ memory cell in FIG. 43, a data write current Ip of the row direction is applied to write word line WWL6, and a data write current Iw of the column direction is applied to bit line BL2. Accordingly, the selected MTJ memory cell receives both a data write magnetic field H(EA) of the easy-axis direction and a data write magnetic field H(HA) of the hard-axis direction beyond switching magnetic field HSW of FIG. 42.

As a result, free magnetic layer VL is magnetized in the direction according to the write data level.

On the other hand, the non-selected memory cells of the same memory cell row and the same memory cell column as that of the selected memory cell (in the example of FIG. 43, the non-selected memory cells corresponding to write word line WWL6 and the non-selected memory cells corresponding to bit line BL2) receive only one of data write magnetic field H(EA) of the easy-axis direction and data write magnetic field H(HA) of the hard-axis direction beyond switching magnetic filed HSW. In these memory cells, the magnetization direction of free magnetic layer VL will not be rewritten. In other words, data write operation will not be conducted theoretically.

If a magnetic noise of the other direction is applied to the above non-selected memory cells, however, data may be erroneously written thereto.

A typical example of such a magnetic noise is a magnetic field generated by a current flowing through a power supply voltage line and a ground line for supplying an operating voltage to the peripheral circuitry for conducting data read operation and data write operation from and to the memory array. The current flowing through the power supply voltage line and the ground line are likely to reach a peak during operation of the peripheral circuitry. Therefore, the magnetic noise from these power; supply lines has a certain level of intensity.

Especially for improved integration, these power supply lines may be provided near the memory array, that is, near tunneling magneto-resistance elements TMR. In this case, the magnetic noise from the power supply lines may cause a reduced operation margin and erroneous writing. Therefore, such problems must be prevented in some way.

SUMMARY OF THE INVENTION

It is an object of the present invention to enables stable operation of a thin film magnetic memory device by suppressing the influences of magnetic noises from power supply lines provided for peripheral circuitry and the like, more specifically, magnetic noises from a power supply voltage line and a ground line.

In summary, according to one aspect of the present invention, a thin film magnetic memory device includes a memory array, a peripheral circuitry, and first and second power supply lines. The memory array has a plurality of memory cells for magnetic data storage arranged therein. Each memory cell includes a magnetic storage portion having an electric resistance varying according to a magnetization direction that is rewritable by application of a prescribed magnetic field. The peripheral circuitry is provided in a region adjacent to the memory array, and conducts data read operation and data write operation from and to the memory array. The first and second power supply lines supply an operating voltage to the peripheral circuitry. The first and second power supply lines are arranged so that a magnetic field generated by a current flowing through the first power supply line and a magnetic field generated by a current flowing through the second power supply line cancel each other in the memory array.

According to another aspect of the present invention, a thin film magnetic memory device includes a memory array, a peripheral circuitry, and first and second power supply lines. The memory array has a plurality of memory cells for magnetic data storage arranged therein. Each memory cell includes a magnetic storage portion having an electric resistance varying according to a magnetization direction that is rewritable by application of a prescribed magnetic field. The peripheral circuitry is provided in a region adjacent to the memory array, and conducts data read operation and data write operation from and to the memory array. The first and second power supply lines supply an operating voltage to the peripheral circuitry. The first and second power supply lines are arranged so that a first magnetic field generated by a current flowing through the first power supply line and a second magnetic field generated by a current flowing through the second power supply line are applied to the memory array in an easy-axis (EA) direction of the magnetic storage portions.

According to still another aspect of the present invention, a thin film magnetic memory device includes a memory array, a peripheral circuitry, and first and second power supply lines. The memory array has a plurality of memory cells for magnetic data storage arranged therein. Each memory cell includes a magnetic storage portion having an electric resistance varying according to a magnetization direction that is rewritable by application of a prescribed magnetic field. The peripheral circuitry is provided in a region adjacent to the memory array, for conducting data read operation and data write operation from and to the memory array. The first and second power supply lines supply an operating voltage to the peripheral circuitry. Each of the first and second power supply lines is provided at least at a prescribed distance away from the magnetic storage portion of a nearest one of the memory cells so that a peak magnetic field generated by a peak current flowing therethrough has a strength smaller than a prescribed value in the magnetic storage portion of the nearest memory cell. The prescribed value is determined in view of magnetization characteristics of the memory cells.

According to yet another aspect of the present invention, a thin film magnetic memory device includes a memory array, a peripheral circuitry, a power supply node, a power supply line, and a decoupling capacitor. The memory array has a plurality of memory cells for magnetic data storage arranged therein. Each memory cell includes a magnetic storage portion having an electric resistance varying according to a magnetization direction that is rewritable by application of a magnetic field. The peripheral circuitry is provided in a region adjacent to the memory array, and conducts data read operation and data write operation from and to the memory array. The power supply node faces the peripheral circuitry in a first direction with the memory array interposed therebetween, and receives an operating power supply voltage of the peripheral circuitry. The power supply line extends between the power supply node and the peripheral circuitry in the first direction, and transmits the operating power supply voltage. The decoupling capacitor is provided between the power supply line and a ground voltage in at least one of a region between the power supply node and the memory array and a region between the peripheral circuitry and the memory array.

According to a further aspect of the present invention, a thin film magnetic memory device includes a memory array and a plurality of dummy magnetic elements. The memory array has a plurality of memory cells for magnetic data storage arranged in a matrix. The plurality of dummy magnetic elements are provided at an end of the memory array along at least one of memory cell rows and memory cell columns, and having a fixed magnetization direction.

According to a still further aspect of the present invention, a thin film magnetic memory device includes a memory array, a plurality of first wirings, and an inductance element. The memory array has a plurality of memory cells for magnetic data storage arranged therein, and each memory cell includes a first magnetic element. The plurality of first wirings are provided for the memory array. Each first wiring is electrically connected to the first magnetic element included in at least one of the plurality of memory cells. The inductance element includes a second wiring formed in a same wiring layer as that of the plurality of first wirings in a region outside the memory array, and a second magnetic element formed in a same layer as that of the first magnetic elements in the region outside the memory array and electrically connected to the second wiring.

According to a yet further aspect of the present invention, a thin film magnetic memory device includes a plurality of memory cells, a first wiring, and a second wiring. The plurality of memory cells are arranged in a matrix for magnetic data storage. The first wiring applies a write magnetic field to a memory cell selected for data write operation. The second wiring is provided farther away from the plurality of memory cells than is the first wiring, and supplies to the first wiring a write current for generating the write magnetic field. In the data write operation, magnetic fields generated from the first and second wirings cancel each other in at least a part of a region along a longitudinal direction of the first and second wirings.

According to a yet further aspect of the present invention, a thin film magnetic memory device includes a plurality of memory cells for magnetic data storage, a plurality of peripheral circuitries, and a plurality of power supply lines. The plurality of memory cells is divided into a plurality of banks. The plurality of banks are selectively written in each write operation. The plurality of peripheral circuitries are provided corresponding to the plurality of banks. Each peripheral circuitry conducts at least data write operation to a corresponding bank. The plurality of power supply lines are provided corresponding to the plurality of peripheral circuitries. Each power supply line supplies an operating voltage to a corresponding peripheral circuitry. Each power supply line is provided in a region corresponding to at least one of banks other than a corresponding bank and a bank that may be written simultaneously with the corresponding bank.

According to a yet further aspect of the present invention, a thin film magnetic memory device includes a plurality of memory cells, a plurality of first write lines, a plurality of second write lines, and a plurality of wirings. The plurality of memory cells are arranged in a matrix for magnetic data storage. The plurality of first write lines are provided corresponding to one of memory cell rows and memory cell columns, and selectively receive a data write current in order to mainly apply a magnetic field of an easy-axis direction to a selected memory cell. The plurality of second write lines are provided corresponding to the other of the memory cell rows and the memory cell columns, and selectively receive a data write current in order to mainly apply a magnetic field of a hard-axis direction to the selected memory cell. The plurality of wirings are formed from an electrically conductive material. A residual magnetic field margin along the easy-axis direction and a residual magnetic field margin along the hard-axis direction have different values when the memory cell is subjected to both a magnetic field noise generated from a nearest one of the first write lines other than the corresponding first write line and a magnetic field noise generated from a nearest one of the second write lines other than the corresponding second write line. One of the plurality of wirings that is located nearest to the memory cells extends in such a direction that a magnetic field generated by a current flowing therethrough mainly has in the memory cells a component along either the easy-axis direction or the hard-axis direction which corresponds to a greater magnetic field residual margin.

According to a yet further aspect of the present invention, a thin film magnetic memory device includes a plurality of memory cells, a plurality of first write lines, a plurality of second write lines, and a power supply line. The plurality of memory cells are arranged in a matrix for magnetic data storage. The plurality of first write lines are provided corresponding to one of memory cell rows and memory cell columns, and selectively receive a data write current in order to mainly apply a magnetic field of an easy-axis direction to a selected memory cell. The plurality of second write lines are provided corresponding to the other of the memory cell rows and the memory cell columns, and selectively receive a data write current in order to mainly apply a magnetic field of a hard-axis direction to the selected memory cell. The power supply line is included in a path of the data write current. A residual magnetic field margin along the easy-axis direction and a residual magnetic field margin along the hard-axis direction have different values when the memory cell is subjected to both a magnetic field noise generated from a nearest one of the first write lines other than the corresponding first write line and a magnetic field noise generated from a nearest one of the second write lines other than the corresponding second write line. The power supply line extends in such a direction that a magnetic field generated by a current flowing therethrough mainly has in the memory cells a component along either the easy-axis direction or the hard-axis direction which corresponds to a greater residual margin.

Accordingly, a main advantage of the present invention is as follows: since the magnetic fields generated by the first and second power supply lines cancel each other in the memory array, erroneous writing and reduced operation margin caused by the magnetic noises from the power supply lines can be prevented, whereby stable operation is achieved.

The magnetic noises from the power supply lines can be applied to the memory array in the easy-axis direction of the magnetic storage portions (tunneling magneto-resistance-elements). This suppresses the magnetic noise of the hard-axis direction to the non-selected memory cell group of the selected column, thereby preventing erroneous writing caused by the magnetic noises generated from the power supply lines in data write operation. In the operation other than data write operation as well, magnetic noises that rotate the magnetization direction of the magnetic storage portions (tunneling magneto-resistance elements) will not be applied to the memory cells. This prevents reduction in read operation margin caused by the magnetic noises from the power supply lines.

The magnetic noise from each power supply line has a peak strength smaller than a prescribed value in the memory cell located nearest to the power supply line, and the prescribed value is determined in view of magnetization characteristics of the memory cells. As a result, the operation stability will not be impeded by the magnetic noises from the power supply lines.

The decoupling capacitor receiving a peak current is provided on a region of the power supply line other than a region near the memory array. Such efficient arrangement of the decoupling capacitor enables suppression of the magnetic noises from the power supply lines.

Moreover, the dummy magneto-resistance elements provided at the end of the memory array prevent the magnetic field from becoming discontinuous at the end of the memory array. Therefore, the operation margin of the memory cells arranged at the end region of the memory array will not be degraded.

The inductance element can be formed using a magnetic element capable of being manufactured simultaneously with the memory cells in the manufacturing process of the memory cells. As a result, the inductance element can be fabricated without increasing the number of steps in the manufacturing process.

A magnetic noise from the first wiring (which corresponds to a leak magnetic filed of the write magnetic filed) and a magnetic noise from the second wiring included in the path of the write current cancel each other in the non-selected memory cells. This reduces the magnetic noises to the non-selected memory cells, thereby improving operation reliability of the thin film magnetic memory device.

When the memory cells are divided into a plurality of banks that are selectively written in data write operation (i.e., the plurality of banks will not be simultaneously selected for data write operation), erroneous writing to the non-selected memory cells is prevented from occurring in the data write operation. As a result, operation reliability of the thin film magnetic memory device is improved.

The non-selected memory cells located near the selected memory cell are most likely to be subjected to erroneous writing of the data. Therefore, one of the wirings other than the write lines which is located nearest to the memory cells extends in such a direction that the nearest wiring applies to these non-selected memory cells a magnetic noise having the same direction as that of a relatively large margin for erroneous writing. This prevents erroneous writing to the non-selected memory cells from occurring in data write operation, whereby operation reliability of the thin film magnetic memory device is improved.

As described above, the non-selected memory cells located near the selected memory cell are most likely to be subjected to erroneous writing of the data. Therefore, a power supply line receiving a relatively large current extends in such a direction that it applies to these non-selected memory cells a magnetic noise having the same direction as that of a relatively large margin for erroneous writing. This prevents erroneous writing to the non-selected memory cells from occurring in data write operation, whereby operation reliability of the thin film magnetic memory device is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
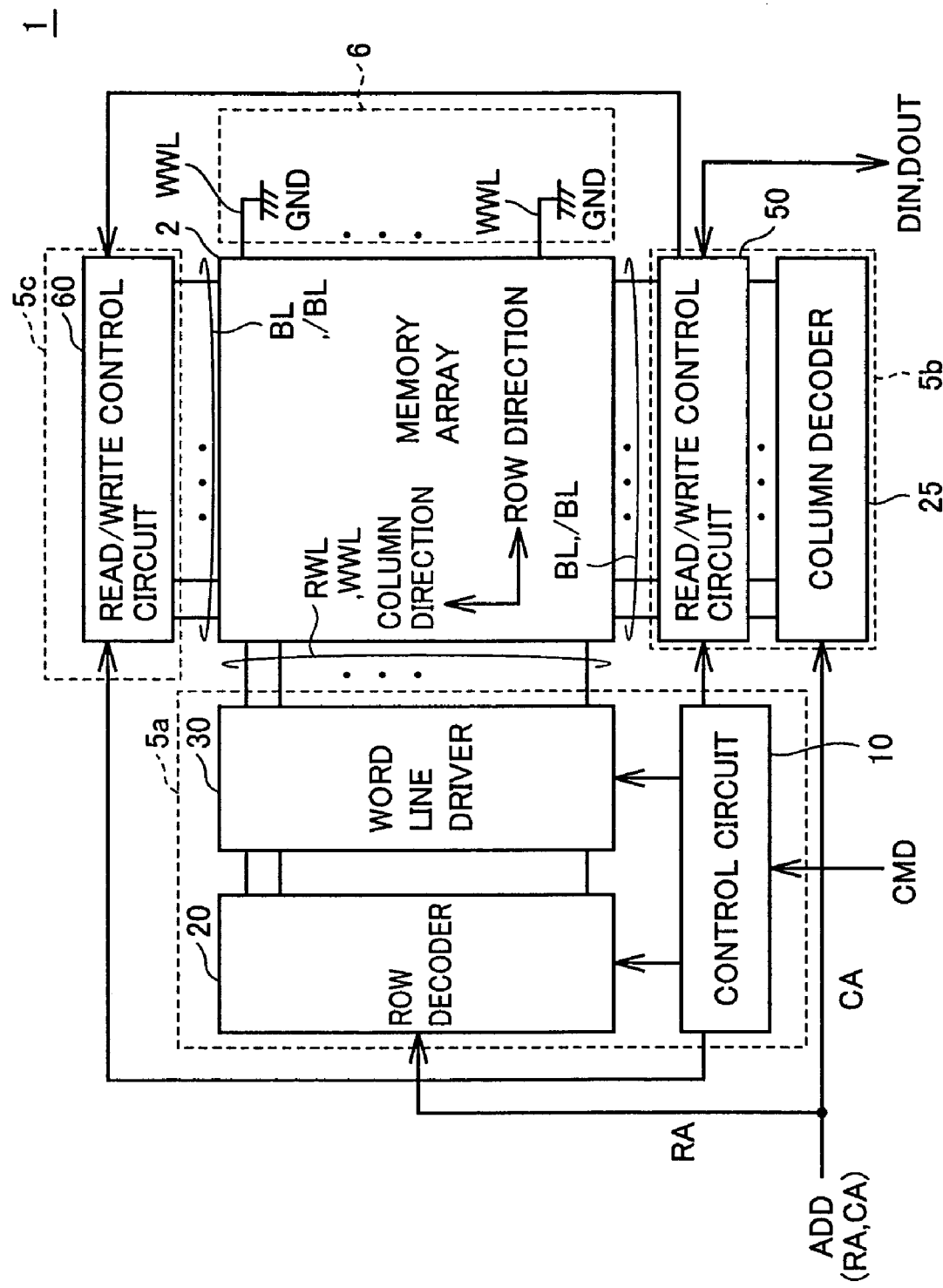
FIG. 1 is a schematic block diagram showing the overall structure of an MRAM device according to an embodiment of the present invention.

Hereinafter, embodiments of the present invention will be described in detail with reference to the accompanying drawings. Note that the same reference numerals and characters denote the same or corresponding portions throughout the figures.

First Embodiment

Referring to FIG. 1, an MRAM device 1 according to an embodiment of the present invention conducts random access in response to an external control signal CMD and an external address signal ADD in order to receive write data DIN and output read data DOUT.

MRAM device 1 includes a memory array 2 having a plurality of MTJ memory cells arranged in a matrix, and peripheral circuits 5a, 5b, 5c for conducting read and write operations from and to memory array 2. Peripheral circuits 5a, 5b, 5c are provided in a region around memory array 2. Hereinafter, peripheral circuits 5a, 5b, 5c are sometimes generally referred to as peripheral circuitry 5 or peripheral circuitry 5#.

A plurality of write word lines WWL and a plurality of read word lines RWL are provided corresponding to the MTJ memory cell rows (hereinafter, sometimes simply referred to as "memory cell rows"). A plurality of bit lines BL are provided corresponding to the MTJ memory cell columns (hereinafter, sometimes simply referred to as "memory cell columns"). The structure of memory array 2 will be described more detail later.

Peripheral circuitry 5 includes a control circuit 10, a row decoder 20, a column decoder 25, a word line driver 30, and read/write control circuits 50, 60. These elements are all provided in the region around memory array 2. Note that the arrangement of peripheral circuitry 5 is not limited to that shown in FIG. 1.

Control circuit 10 controls the overall operation of MRAM device 1 in order to conduct a prescribed operation according to control signal CMD. Row decoder 20 selects a row in memory array 2 according to a row address RA designated by address signal ADD. Column decoder 25 selects a column in memory array 2 according to a column address CA designated by address signal ADD.

Word line driver 30 selectively activates a read word line RWL (in data read operation) or a write word line WWL (in data write operation) based on the row selection result of row decoder 20. Row address RA and column address CA designate an MTJ memory cell to be read or written (hereinafter, sometimes referred to as "selected memory cell").

Write word lines WWL are coupled to a ground voltage GND in a region 6 facing word line driver 30 with memory array 2 interposed therebetween. Read/write control circuits 50, 60 collectively refer to a circuit group that is provided in a region adjacent to memory array 2 in order to apply a data write current and a sense current (data read current) to a bit line BL of the selected memory cell column (hereinafter, sometimes referred to as "selected column") in the read and write operations.

Figure 2:
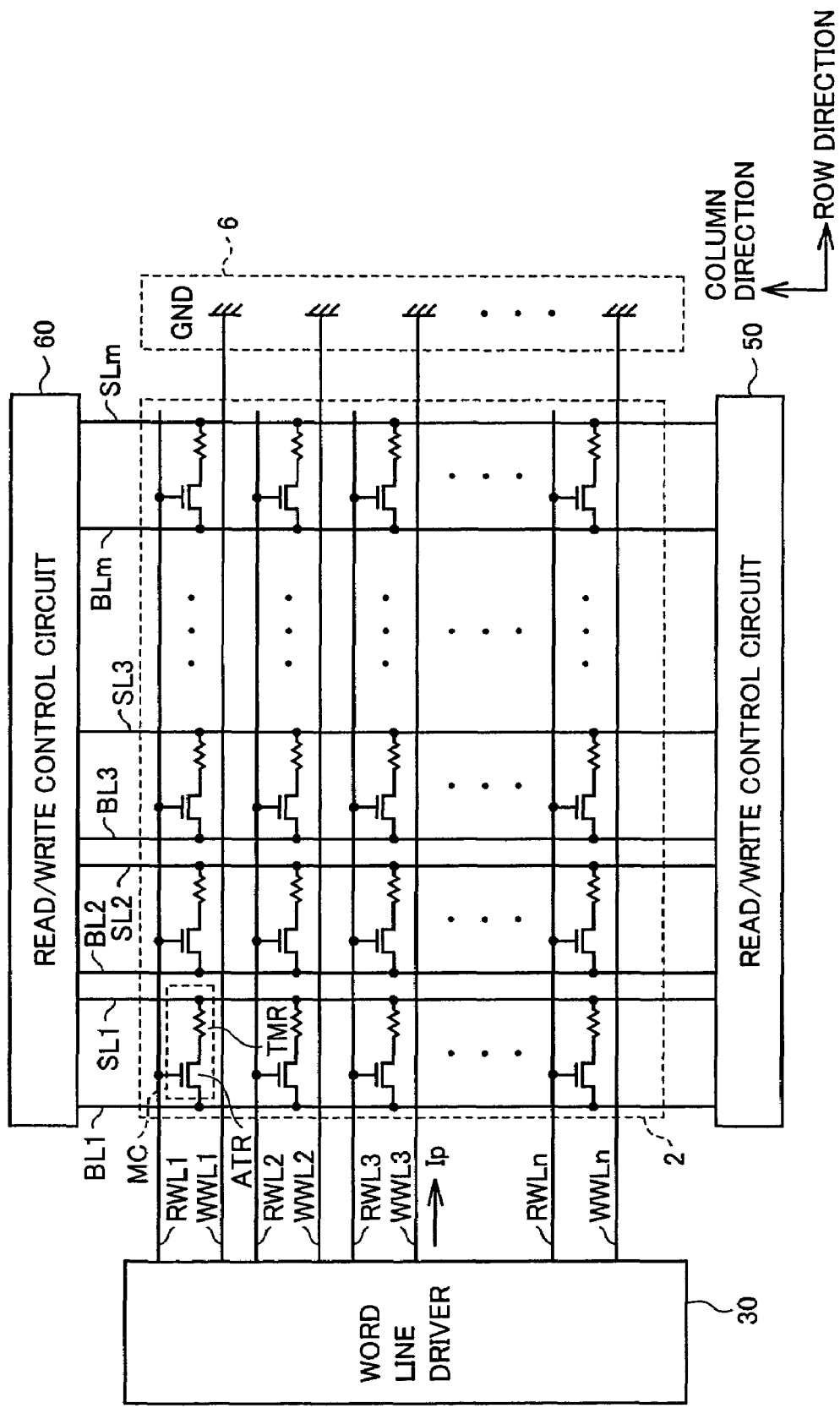
FIG. 2 is a circuit diagram showing an example of the structure of a memory array in FIG. 1.

Referring to FIG. 2, memory array 2 has a plurality of MTJ memory cells MC arranged in n rows by m columns (where n, m is a natural number). A read word line RWL, a write word line WWL, a bit line BL and a reference voltage line SL are provided for each MTJ memory cell MC. Read word lines RWL and write word lines WWL extend in the row direction corresponding to the memory cell rows. Bit lines BL and reference voltage lines SL extend in the column direction corresponding to the memory cell columns.

Accordingly, read word lines RWL1 to RWLn, write word lines WWL1 to WWLn, bit lines BL1 to BLm and reference voltage lines SL1 to SLm are provided in the entire memory array 2. Note that, hereinafter, the read word lines, write word lines, bit lines and reference voltage lines are sometimes generally referred to as RWL, WWL, BL and SL, and sometimes specifically referred to as RWL1, WWL1, BL1, SL1 and the like.

In data write operation, word line driver 30 couples one end of a write word line WWL of the selected memory cell row (hereinafter, sometimes referred to as "selected row") to a power supply voltage Vcc. As described above, the other end of each write word line WWL is coupled to ground voltage GND in region 6. This allows a data write current Ip of the row direction to be applied to write word line WWL of the selected row in the direction from word line driver 30 toward region 6.

Figure 3:
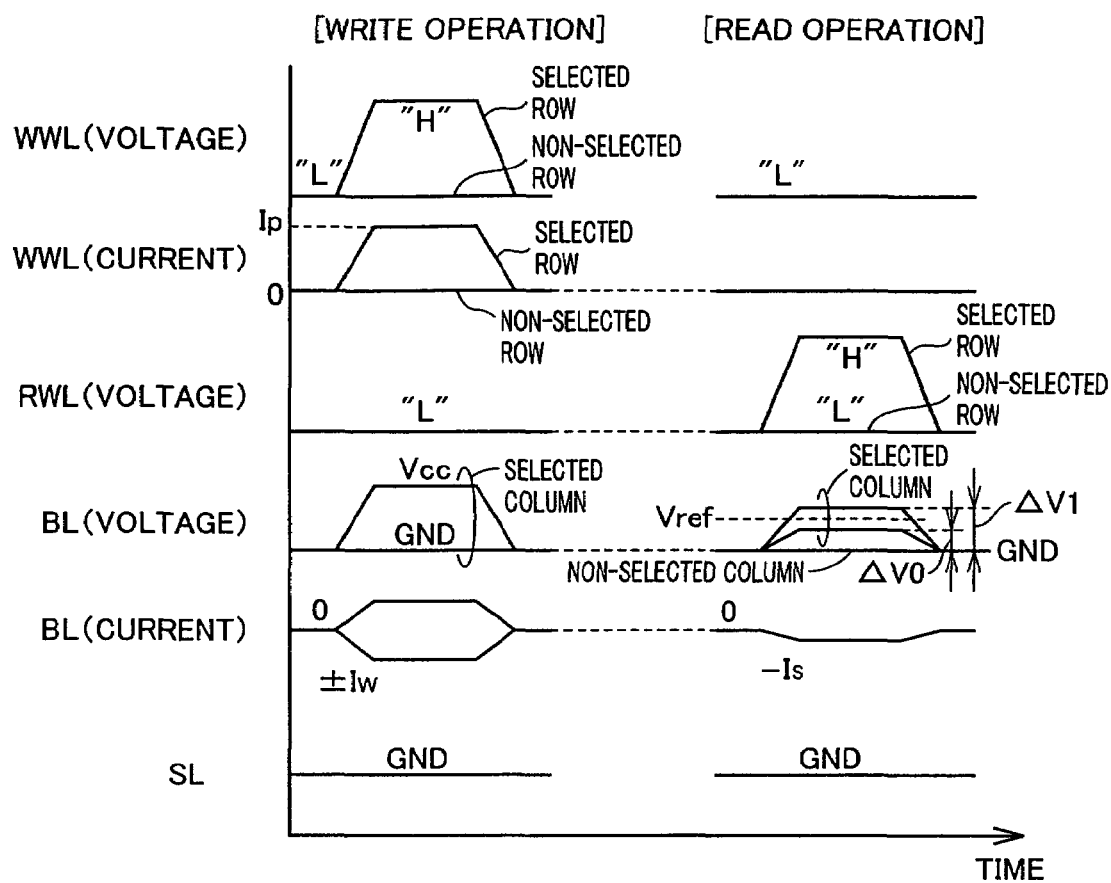
FIG. 3 is a waveform chart illustrating data write operation and data read operation to and from an MTJ memory cell.

FIG. 3 is a waveform chart illustrating data write operation and data read operation to and from an MTJ memory cell.

First, data write operation will be described. Word line driver 30 couples a write word line WWL of the selected row to power supply voltage Vcc according to the row selection result of row decoder 20 in order to activate it to high level (hereinafter, referred to as "H level"). On the other hand, write word lines WWL of the non-selected rows are retained in inactive state, i.e., at low level (hereinafter, referred to as "L level"), and therefore the voltage thereof is retained at ground voltage GND.

A data write current Ip of the row direction thus flows through write word line WWL of the selected row. As a result, a magnetic field of the direction along the hard axis HA of free magnetic layer VL is applied to each tunneling magneto-resistance element TMR in the MTJ memory cells of the selected row. No current flows through write word lines WWL of the non-selected rows.

In data write operation, no read word line RWL is activated. In other words, read word lines RWL are retained in inactive state (L level), and access transistors ATR are not turned ON. Accordingly, reference voltage lines SL do not act, and the voltage thereof is retained at ground voltage GND.

Read/write control circuits 50, 60 controls bit line voltages at both ends of memory array 2 so that a data write current ±Iw having the direction according to the write data level is produced on bit line BL of the selected column.

For example, in order to write data "1", read/write control circuit 60 sets the bit line voltage to high-voltage state (H level: power supply voltage Vcc), and read/write control circuit 50 sets the bit line voltage to low-voltage state (L level: ground voltage GND). As a result, a data write current +Iw flows through bit line BL of the selected column in the direction from read/write control circuit 60 toward read/write control circuit 50.

In order to write data "0", read/write control circuits 50, 60 control the bit line voltages in the opposite manner. As a result, a data write current −Iw flows through bit line BL of the selected column in the direction from read/write control circuit 50 toward read/write control circuit 60.

Data write current ±Iw flowing through bit line BL in the column direction generates a data write magnetic field. This data write magnetic field is applied to tunneling magneto-resistance element TMR in the easy-axis direction of free magnetic layer VL.

By setting the respective directions of data write currents Ip, ±Iw, free magnetic layer VL in the selected memory cell can be magnetized along the easy axis in the direction according to the write data level.

Note that, the direction of data write current ±Iw for generating a magnetic field in the easy-axis direction is herein controlled according to the write data level, and the direction of data write current Ip for generating a magnetic field in the hard-axis, direction is fixed regardless of the write data level. This simplifies the structure for applying a data write current to write word line WWL.

Hereinafter, data read operation will be described.

In data read operation, word line driver 30 activates a read word line RWL of the selected row to H level according to the row selection result of row decoder 20. Read word lines RWL of the non-selected rows are retained in inactive state (L level). In data read operation, no write word line WWL is activated. In other words, every write word line WWL is retained in inactive state (L level: ground voltage GND).

Before data read operation, bit lines BL are precharged to, e.g., ground voltage GND. When data read operation is started, a read word line RWL of the selected row is activated to H level, and corresponding access transistors ATR are turned ON. In the MTJ memory cells corresponding to these access transistors ATR, tunneling magneto-resistance elements TMR are each electrically coupled between a reference voltage (ground voltage GND) and a corresponding bit line BL.

For example, if a bit line of the selected column is pulled up to power supply voltage Vcc, a sense current Is is applied only to tunneling magneto-resistance element TMR of the selected memory cell. As a result, bit line BL of the selected column is subjected to a voltage change according to the electric resistance of tunneling magneto-resistance element TMR in the selected memory cell, that is, according to the storage data level of the selected memory cell.

It is now assumed that ΔV0 and ΔV1 denote a voltage change on bit line BL of the selected column when the selected memory cell stores data "0" and "1", respectively. The storage data of the selected memory cell is read by sensing and amplifying the difference between the voltage on bit line BL of the selected memory cell and reference voltage Vref. Reference voltage Vref has an intermediate value of ΔV0 and ΔV1.

The voltage level of reference voltage lines SL is set to ground voltage GND in both read and write operations. Accordingly, reference voltage lines SL need only be coupled to a node for supplying ground voltage GND within, e.g., a region in read/write control circuit 50 or 60. Reference voltage lines SL may either extend in the row direction or column direction.

Note that, as is appreciated from the following description, the present invention is directed to the arrangement of power supply lines for supplying an operating voltage to the peripheral circuitry of memory array 2. Although FIG. 2 shows a simple memory array structure, the present invention is applicable regardless of the arrangement of MTJ memory cells and signal lines (such as bit lines BL) in memory array 2. For example, the present invention is applicable to a memory array having an open bit line structure or a folded bit line structure.

Figure 4:
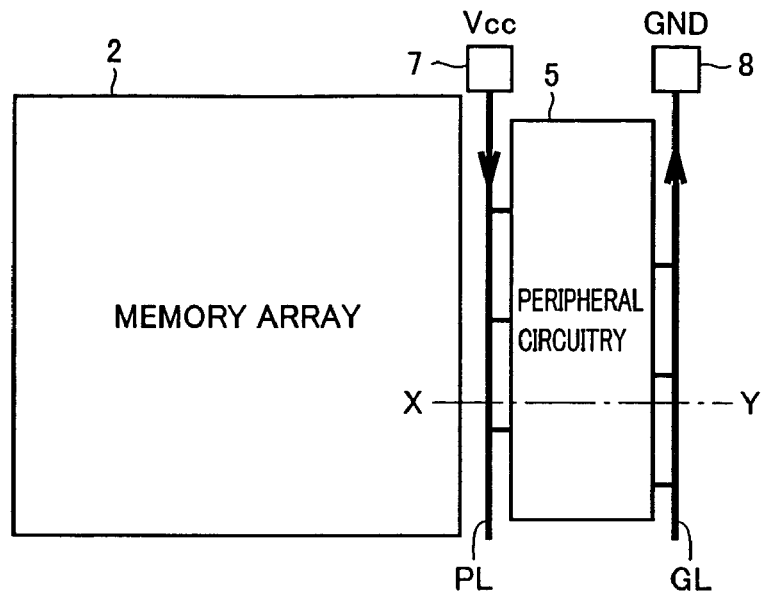
FIG. 4 is a block diagram illustrating the arrangement of power supply lines for peripheral circuitry according to a first embodiment of the present invention.

FIG. 4 is a block diagram illustrating the arrangement of power supply lines for the peripheral circuitry according to the first embodiment.

Peripheral circuitry 5 in FIG. 4 corresponds to each peripheral circuit 5a, 5b, 5c of FIG. 1. Referring to FIG. 4, operating voltages of peripheral circuit 5, that is, power supply voltage Vcc and ground voltage GND, are supplied through a power supply voltage line PL and a ground line GL.

Hereinafter, power supply voltage line PL and ground line GL are sometimes generally referred to as "power supply lines".

Power supply voltage line PL is coupled to a power supply node 7 for receiving power supply voltage Vcc from the outside, and supplies power supply voltage Vcc to peripheral circuitry 5. Similarly, ground line GL is coupled to a ground node 8 for receiving ground voltage GND from the outside, and supplies ground voltage GND to peripheral circuitry 5. These power supply lines are arranged so that the magnetic fields respectively generated by the current flowing through power supply voltage line PL and ground line GL cancel each other in memory array 2.

In the example of FIG. 4, power supply voltage line PL and ground line GL extend in the same direction in the region near peripheral circuitry 5. Moreover, power supply node 7 and ground node 8 are provided so that the currents flow through power supply voltage line PL and ground line GL in the opposite directions.

Figure 5:
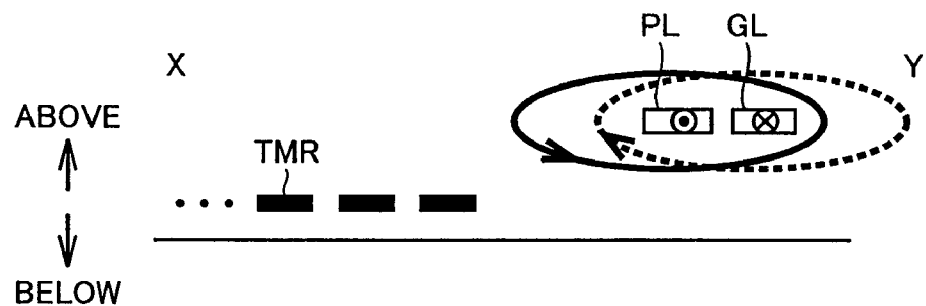
FIG. 5 is a cross-sectional view taken along line X–Y in FIG. 4, showing a first arrangement example of the power supply lines according to the first embodiment.
Figure 6:
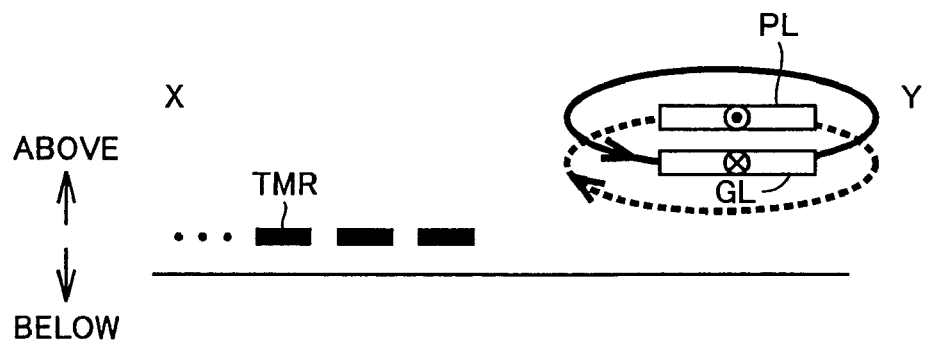
FIG. 6 is a cross-sectional view taken along line X–Y in FIG. 4, showing a second arrangement example of the power supply lines according to the first embodiment.

FIGS. 5 and 6 are cross-sectional views taken along line X–Y in FIG. 4. FIGS. 5 and 6 shows first and second arrangement examples of the power supply lines according to the first embodiment.

Referring to FIG. 5, in the first arrangement example of the first embodiment, power supply voltage line PL and ground line GL are provided in a region near memory array 2. Power supply voltage line PL and ground line GL are both formed in a metal wiring layer located either above or below tunneling magneto-resistance elements TMR. In FIG. 5, power supply voltage line PL and ground line GL are arranged in the layer located above tunneling magneto-resistance element TMR. However, these power supply lines may alternatively be provided in a layer located below tunneling magneto-resistance element TMR.

With this structure, the magnetic field generated by the current flowing through power supply voltage line PL (shown by solid line in FIG. 5) and the magnetic field generated by the current flowing through ground line GL (shown by dashed line in FIG. 5) cancel each other in memory array 2, that is, tunneling magneto-resistance element TMR.

An inrush peak current is generated on these power supply lines especially upon power-on or during circuit operation. However, magnetic noises caused by the peak current on these power supply lines also cancel each other in memory array 2. Therefore, the MRAM device can be stably operated while preventing erroneous writing to the MTJ memory cells.

Moreover, metal wirings formed in the same metal wiring layer can be used as power supply voltage line PL and ground line GL. This reduces the number of metal wiring layers required for the MRAM device, thereby contributing to simplification of the manufacturing process.

Referring to FIG. 6, in the second arrangement example of the first embodiment, power supply voltage line PL and ground line GL are formed in different wiring layers located either above or below tunneling magneto-resistance elements TMR. Power supply voltage line PL and ground line GL overlap each other in the vertical direction.

This structure further reduces the difference between the distance from power supply voltage line PL to memory array 2 and the distance from ground line GL to memory array 2. As a result, the magnetic noises from the power supply lines cancel each other in memory array 2 to a greater degree. Accordingly, an operation margin can be more effectively assured as well as erroneous operation is more effectively prevented as compared to the arrangement example of FIG. 5.

First Modification of First Embodiment

In the first modification of the first embodiment, the memory array is divided into a plurality of memory blocks, and the peripheral circuits are provided corresponding to the memory blocks. The arrangement of power supply lines in the above structure will be described.

Figure 7:
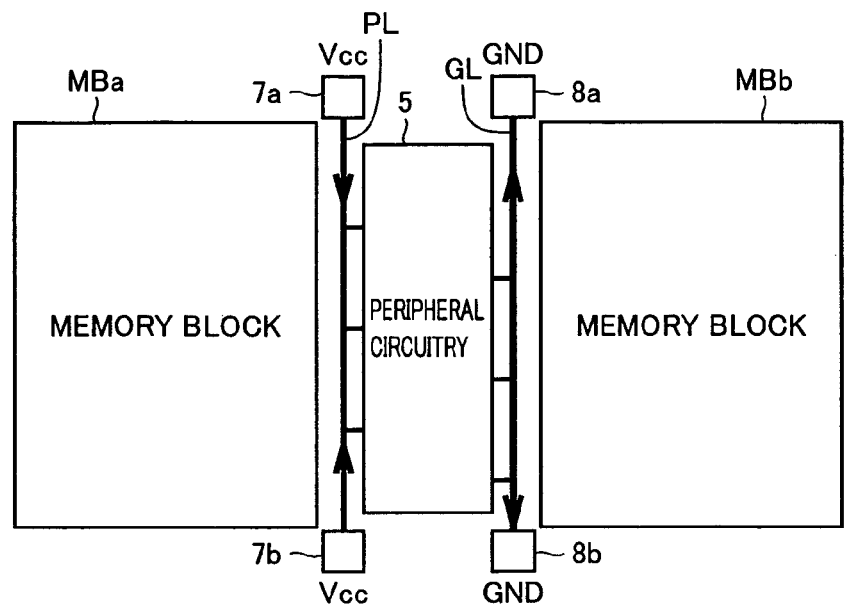
FIG. 7 is a block diagram illustrating a first arrangement example of the power supply lines for peripheral circuitry according to a first modification of the first embodiment.
Figure 8:
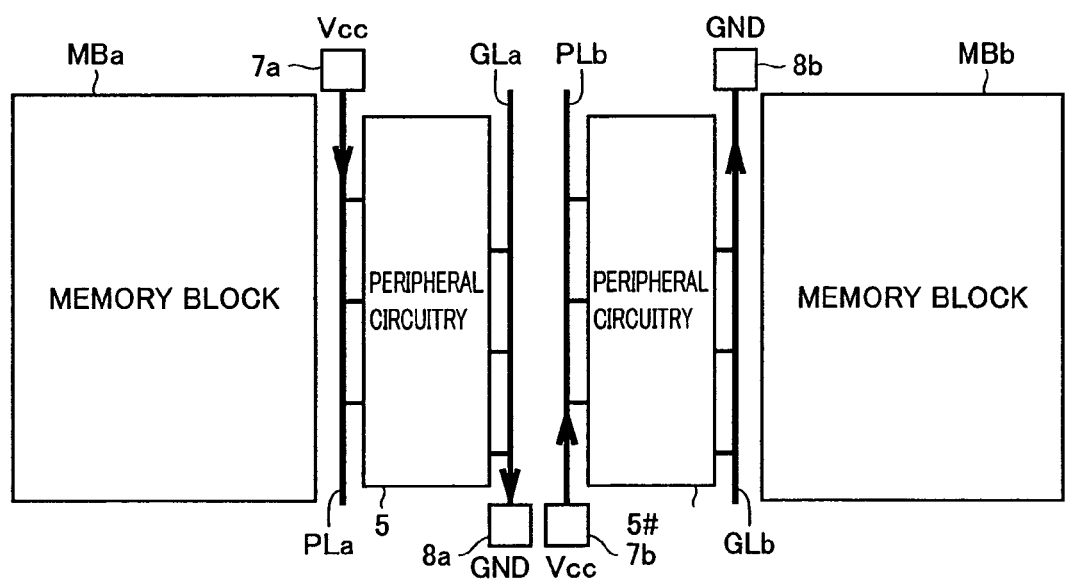
FIG. 8 is a block diagram illustrating a second arrangement example of the power supply lines for peripheral circuitries according to the first modification of the first embodiment.

FIGS. 7 and 8 are block diagrams respectively showing first and second arrangement examples of the power supply lines for the peripheral circuits according to the first modification of the first embodiment.

Referring to FIG. 7, memory array 2 of FIG. 1 is divided into, e.g., two memory blocks MBa, MBb. In the first arrangement example, peripheral circuitry 5 shared by memory blocks MBa, MBb is provided at the boundary between memory blocks MBa, MBb. Like the first embodiment, power supply voltage Vcc and ground voltage GND are supplied to peripheral circuitry 5 through power supply voltage line PL and ground line GL. Power supply nodes 7a, 7b are provided at both ends of power supply voltage line PL, and ground nodes 8a, 8b are provided at both ends of ground line GL. Specific arrangement of power supply voltage line PL and ground line GL is the same as that of FIGS. 5 and 6.

With the above structure, a current flows through the respective current paths on power supply voltage line PL and ground line GL for supplying power supply voltage Vcc and ground voltage GND to each part of peripheral circuitry 5. The magnetic fields generated by the currents flowing through the current paths cancel each other in the memory block. Accordingly, the same effects as those of the first embodiment can be obtained even when the peripheral circuitry is provided for memory array 2 divided into a plurality of memory blocks.

Referring to FIG. 8, in the second arrangement example according to the first modification of the first embodiment, the peripheral circuitry is provided for every memory block. In the illustrated example, peripheral circuitries 5, 5# are provided corresponding to memory blocks MBa, MBb, respectively.

Power supply voltage Vcc and ground voltage GND are supplied to peripheral circuitry 5 through a power supply voltage line PLa and a ground line GLa. Similarly, power supply voltage Vcc and ground voltage GND are supplied to peripheral circuitry 5# through a power supply voltage line PLb and a ground line GLb.

Power supply voltage lines PLa, PLb and ground lines GLa, GLb extend in the same direction. Power supply nodes 7a, 7b for supplying power supply voltage Vcc to respective power supply voltage lines PLa, PLb face each other along the extending direction of the power supply lines with the memory blocks (memory array) interposed therebetween. Similarly, ground nodes 8a, 8b for supplying ground voltage GND to respective ground lines GLa, GLb face each other along the extending direction of the power supply lines with the memory blocks (memory array) interposed therebetween.

The power supply node and the ground node corresponding to the same peripheral circuitry face each other with the memory blocks (memory array) interposed therebetween. As a result, a current flows in the same directions in power supply voltage line PLa and ground GLa corresponding to pheripheral circuitry 5. Similarly, a current flows in the same directions in power supply voltage line PLb and ground line GLb corresponding to peripheral circuitry 5#. Moreover, a current flows in the opposite directions in power supply voltage lines PLa, PLb, and a current flows in the opposite directions in ground lines GLa, GLb.

Each of a pair of power supply voltage lines PLa, PLb and a pair of ground lines GLa, GLb needs only be formed in a metal wiring layer or layers located either above or below tunneling magneto-resistance elements TMR as a pair of power supply lines PL and around line GL in the case of FIG. 5 or 6.

With this structure, the same effects as those of the first embodiment can be obtained even when the memory array is divided into a plurality of blocks and the peripheral circuitry is provided for every memory block.

Second Modification of First Embodiment

In the first embodiment and the first modification thereof, the power supply lines for the peripheral circuitry are provided in the region around the memory array (i.e., in the vicinity of the memory array). For improved integration of the MRAM device, power supply lines may be provided above or below the memory array so as to extend across the memory array.

Figure 9:
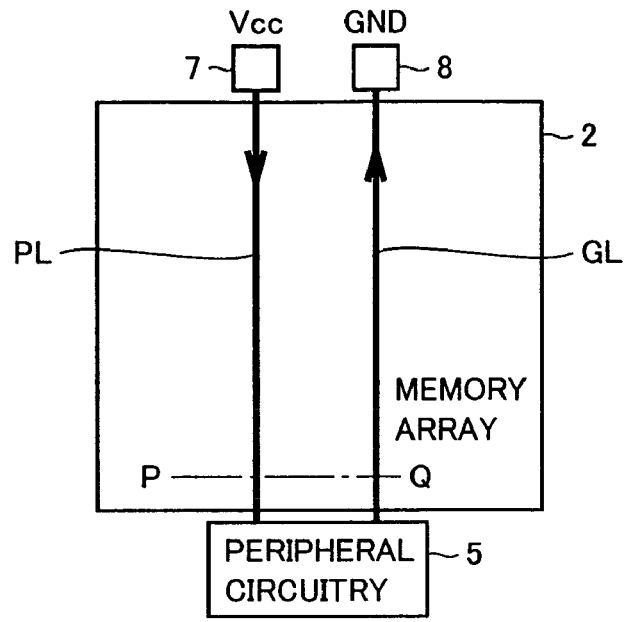
FIG. 9 is a block diagram illustrating a first arrangement example of the power supply lines for peripheral circuitry according to a second modification of the first embodiment.

FIG. 9 is a block diagram illustrating a first arrangement example of the power supply lines for the peripheral circuitry according to the second modification of the first embodiment.

Referring to FIG. 9, in the first arrangement example according to the second modification of the first embodiment, power supply voltage line PL and ground line GL for supplying power supply voltage Vcc and ground voltage GND to peripheral circuitry 5 are provided above and/or below memory array 2 so as to extend across memory array 2.

Power supply node 7 and ground node 8 face peripheral circuitry 5 along the extending direction of the power supply lines with memory array 2 interposed therebetween. Accordingly, a current flows in the opposite directions in power supply voltage line PL and ground line GL.

Figure 10A:
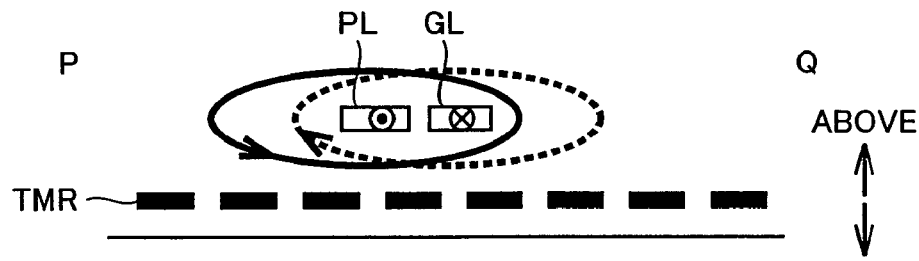
FIGS. 10A, 10B and 10C are cross-sectional views taken along line P–Q in FIG. 9, showing the first arrangement example of the power supply lines according to the second modification of the first embodiment.
Figure 10B:
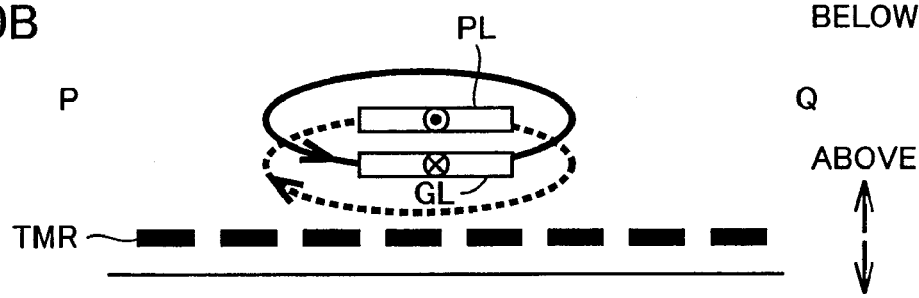
Figure 10C:
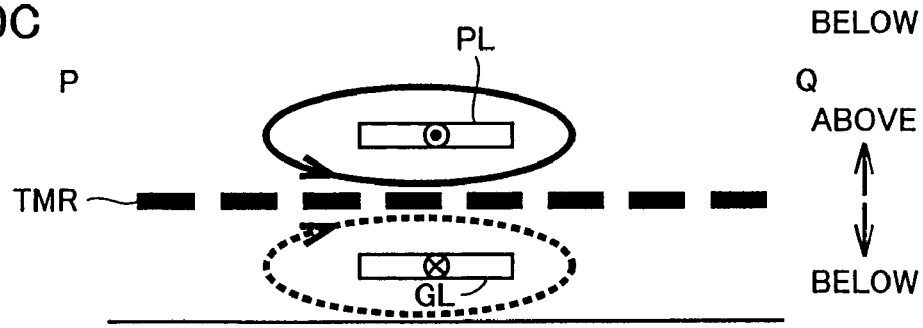

FIGS. 10A to 10C are cross-sectional views taken along line P–Q in FIG. 9. FIGS. 10A to 10C specifically show the first arrangement example of the power supply lines according to the second modification of the first embodiment.

In the example of FIG. 10A, power supply voltage line PL and ground line GL are formed in a metal wiring layer located either above or below tunneling magneto-resistance elements TMR, as in the case of FIG. 5. In FIG. 10A, power supply voltage line PL and ground line GL are formed in a layer located above tunneling magneto-resistance elements TMR. However, these power supply lines may be formed in a layer located below tunneling magneto-resistance elements TMR. Moreover, forming these power supply lines in the same metal wiring layer reduces the number of metal wiring layers required for the MRAM device.

With this structure, a reduced operation margin and erroneous writing caused by the magnetic noises from the power supply lines can be prevented even when the power supply lines are provided above or below memory array 2 so as to extend across memory array 2.

In the example of FIG. 10B, power supply voltage line PL and ground line GL are formed in different metal wiring layers located either above or below tunneling magneto-resistance elements TAR, and overlap each other in the vertical direction, as in the case of FIG. 6.

This structure also prevents the adverse effects of the magnetic noises from the power supply lines as in the case of FIG. 10A. Note that, in FIG. 10B as well, power supply voltage line PL and ground line GL may be formed in a layer located below tunneling magneto-resistance elements TMR.

As shown in FIG. 10C, power supply voltage line PL and ground line GL may be provided in the layers located above and below tunneling magneto-resistance elements TMR, respectively. However, since a current flows in the opposite directions in power supply voltage line PL and ground line GL, the magnetic noises generated by these power supply lines interact with each other in a constructive manner in the region where tunneling magneto-resistance elements TMR are provided (i.e., memory array). Accordingly, in the case where a current flows in the opposite directions in power supply voltage line PL and ground line GL, these power supply lines must be provided in a layer or layers located either above or below tunneling magneto-resistance elements TMR.

Figure 11:
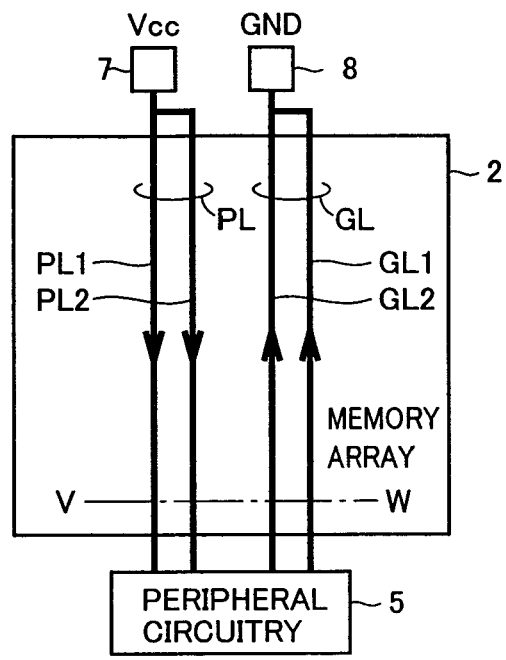
FIG. 11 is a block diagram illustrating a second arrangement example of the power supply lines for peripheral circuitry according to the second modification of the first embodiment.

FIG. 11 is a block diagram illustrating a second arrangement example of the power supply lines for the peripheral circuitry according to the second modification of the first embodiment.

Referring to FIGS. 9 and 11, in the second arrangement example according to the second modification of the first embodiment, a plurality of power supply voltage lines PL and a plurality of ground lines GL are provided for supplying power supply voltage Vcc and ground voltage GND to peripheral circuitry 5. In FIG. 11, two power supply voltage lines PL1, PL2 and two ground lines GL1, GL2 are provided by way of example. A current flows in the same direction in power supply voltage lines PL1, PL2. Similarly, a current flows in the same direction in ground lines GL1, GL2. This structure reduces the current density of each wiring, thereby reducing the possibility of disconnection of wirings caused by electromigration or the like.

Figure 12A:
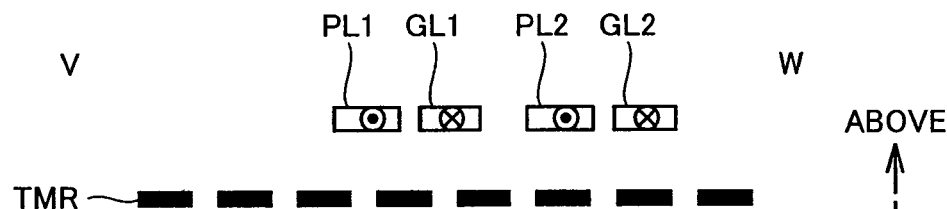
FIGS. 12A, 12B and 12C are cross-sectional views taken along line V–W in FIG. 11, showing the second arrangement example of the power supply lines according to the second modification of the first embodiment.
Figure 12B:
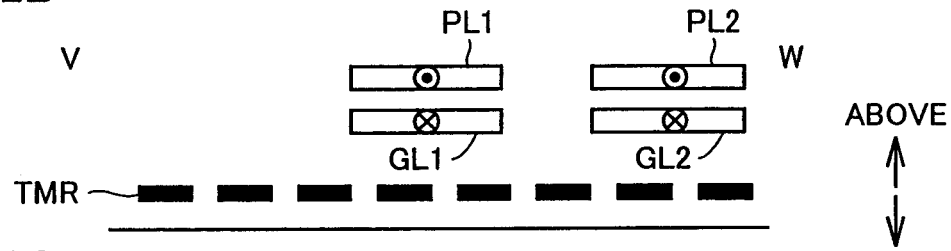
Figure 12C:
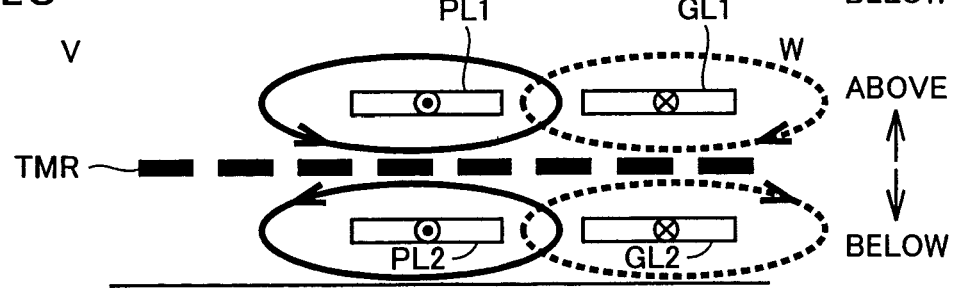

FIGS. 12A to 12C are cross-sectional views taken along line V–W in FIG. 11. FIGS. 12A to 12C specifically show the second arrangement example of the power supply lines according to the second modification of the first embodiment.

In the example of FIG. 12A, power supply voltage lines PL1, PL2 and ground lines GL1, GL2 are formed in a metal wiring layer located either above or below tunneling magneto-resistance elements TMR, as in the case of FIG. 10A. In the illustrated example, the power supply lines are formed in a layer located above tunneling magneto-resistance elements TMR. However, the power supply lines may alternatively be formed in a layer located below tunneling magneto-resistance elements TMR. Forming the power supply lines in the same metal wiring layer reduces the number of metal wiring layers required for the MRAM device.

In the example of FIG. 12B, power supply voltage lines PL1, PL2 and ground lines GL1, GL2 are formed in different metal wiring layers located either above or below tunneling magneto-resistance elements TMR, and overlap each other in the vertical direction, as in the case of FIG. 10B. In the illustrated example, the power supply lines are formed in the layers located above tunneling magneto-resistance elements TMR. However, the power supply lines may be formed in metal wiring layers located below tunneling magneto-resistance elements TMR.

In the example of FIG. 12C, the power supply lines are formed in the layers located above and below tunneling magneto-resistance elements TMR. For example, power supply voltage line PL1 and ground line GL1 are formed in the same metal wiring layer located above tunneling magneto-resistance elements TMR, and power supply voltage line PL2 and ground line GL2 are formed in the same metal wiring layer located below tunneling magneto-resistance elements TMR.

In this example, the wirings having the same current direction vertically overlap each other with tunneling magneto-resistance elements TMR interposed therebetween. In other words, the wirings are arranged in pairs according to the current direction. Preferably, the wirings of each pair are arranged vertically symmetrically with respect to tunneling magneto-resistance elements TMR. For example, power supply voltage lines PL1, PL2 having the same current direction are arranged vertically symmetrically with respect to tunneling magneto-resistance elements TMR. Similarly, ground lines GL1, GL2 having the same current direction are arranged vertically symmetrically with respect to tunneling magneto-resistance elements TMR.

With this structure, the magnetic noises generated from the power supply lines cancel each other in tunneling magneto-resistance elements TMR. As a result, the arrangement of power supply lines capable of suppressing the adverse effects of the magnetic noises from the power supply lines can be implemented using both metal wiring layers located above and below tunneling magneto-resistance elements TMR.

Third Modification of First Embodiment

In the third modification of the first embodiment, the peripheral circuitries are provided on both sides of the memory array. The arrangement of power supply lines in this structure will now be described.

Figure 13:
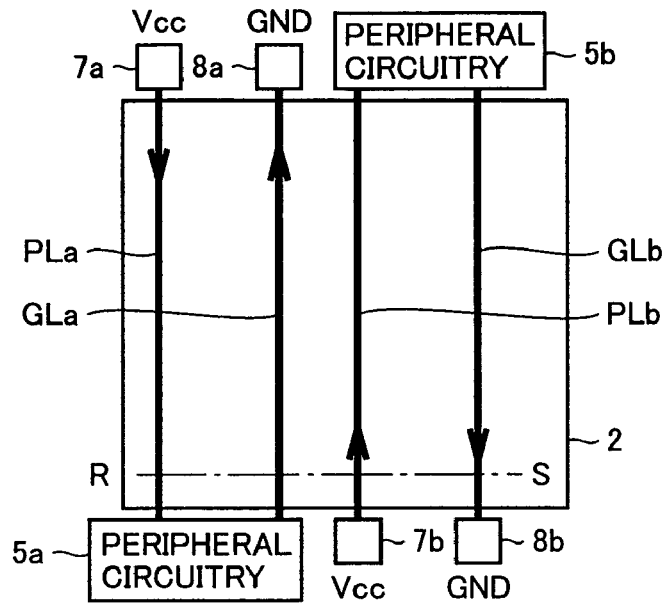
FIG. 13 is a block diagram illustrating an arrangement example of the power supply lines for peripheral circuitries according to a third modification of the first embodiment.

FIG. 13 is a block diagram illustrating the arrangement of power supply lines according to the third modification of the first embodiment.

Referring to FIG. 13, in the third modification of the first embodiment, the power supply lines supply power supply voltage Vcc and ground voltage GND to peripheral circuitries 5a, 5b that face each other with memory array 2 interposed therebetween.

More specifically, power supply voltage line PLa and ground line GLa supply power supply voltage Vcc and ground voltage GND to peripheral circuitry 5a. Power supply voltage line PLb and ground line GLb supply power supply voltage Vcc and ground voltage GND to peripheral circuitry 5b. As in the case of FIG. 9, a current flows in the opposite directions in the power supply voltage line and the ground line for supplying an operating voltage to the same peripheral circuitry.

For example, power supply node 7a and ground node 8a corresponding to peripheral circuitry 5a face peripheral circuitry 5a with memory array 2 interposed therebetween. Power supply voltage line PLa extends between power supply node 7a and peripheral circuitry 5a, and ground line GLa extends between ground node 8a and peripheral circuitry 5a.

Similarly, power supply node 7b and ground node 8b corresponding to peripheral circuitry 5b face peripheral circuitry 5b with memory array 2 interposed therebetween. Power supply voltage line PLb extends between power supply node 7b and peripheral circuitry 5b, and ground line GLb extends between ground node 8b and peripheral circuitry 5b.

Accordingly, a current flows in the opposite directions in power supply voltage lines PLa, PLb, and flows in the opposite directions in ground lines GLa, GLb.

Figure 14A:
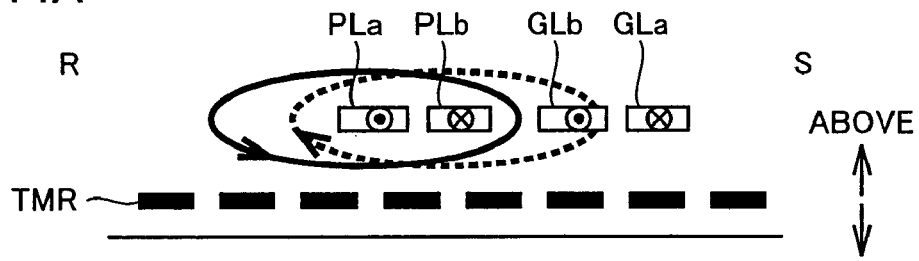
FIGS. 14A, 14B and 14C are cross-sectional views taken along line R–S in FIG. 13, showing the arrangement example of the power supply lines according to the third modification of the first embodiment.
Figure 14B:
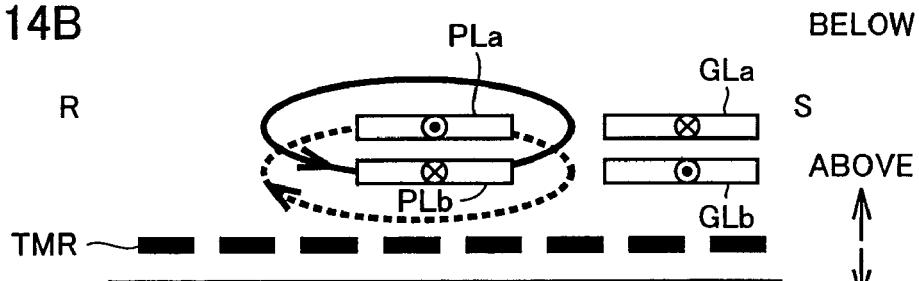
Figure 14C:
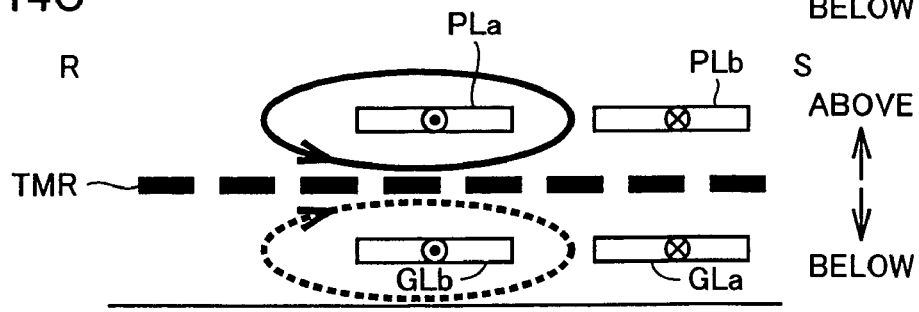

FIGS. 14A to 14C are cross-sectional views taken along line R–S in FIG. 13. FIGS. 14A to 14C specifically show the arrangement of power supply lines according to the third modification of the first embodiment.

Referring to FIG. 14A, in a first arrangement example, power supply voltage lines PLa, PLb and ground lines GLa, GLb are formed in a metal wiring layer located either above or below tunneling magneto-resistance elements TMR. Power supply voltage lines PLa, PLb having opposite current directions are arranged close to each other. Similarly, ground lines GLa, GLb are arranged close to each other.

This structure enables suppression of the adverse effects of the magnetic noises from the power supply lines on the memory array, the region where tunneling magneto-resistance elements TMR are provided. In the example of FIG. 14A, the power supply lines are formed in the layer located above tunneling magneto-resistance elements TMR. However, these power supply lines may alternatively be formed in a layer located below tunneling magneto-resistance elements TMR. Moreover, forming the power supply lines in the same metal wiring layer reduces the number of metal wiring layers required for the MRAM device.

Referring to FIG. 14B, in a second arrangement example, power supply voltage lines PLa, PLb are formed close to each other in different metal wiring layers located either above or below tunneling magneto-resistance elements, and overlap each other in the vertical direction. Similarly, ground lines GLa, GLb are formed close to each other in different metal wiring layers located either above or below tunneling magneto-resistance elements, and overlap each other in the vertical direction.

In this case, a current flows in the opposite directions in the power supply lines formed in the same metal wiring layer. In other words, power supply voltage line PLa and ground line GLa are formed in the same metal wiring layer, and power supply voltage line PLb and ground line GLb are formed in the same metal wiring layer.

As in the case of FIG. 14A, this structure enables suppression of the adverse effects of the magnetic noises from the power supply lines on the region where tunneling magneto-resistance elements TMR are provided (i.e., memory array).

In the example of FIG. 14B, the power supply lines are formed in the metal wiring layers located above tunneling magneto-resistance elements TMR. However, these power supply lines may alternatively be formed in the metal wiring layers located below tunneling magneto-resistance elements TMR.

Referring to FIG. 14C, in a third arrangement example, the power supply lines are formed in the layers located above and below tunneling magneto-resistance elements TMR, as in the case of FIG. 12C. For example, power supply voltage lines PLa, PLb are formed in the same metal wiring layer located above tunneling magneto-resistance elements TMR, and ground lines GLb, GLa are formed in the same metal wiring layer located below tunneling magneto-resistance elements TMR.

In this example, the wirings having the same current direction are arranged vertically symmetrically with respect to tunneling magneto-resistance elements TMR. The wirings are thus arranged in pairs according to the current direction. For example, power supply voltage line PLa and ground line GLb having the same current direction are arranged vertically symmetrically with respect to tunneling magneto-resistance elements TMR. Similarly, power supply voltage line PLb and ground line GLa having the same current direction are arranged vertically symmetrically with respect to tunneling magneto-resistance elements TMR.

As a result, the arrangement of power supply lines capable of suppressing the adverse effects of the magnetic noises from the power supply lines can be implemented using both metal wiring layers located above and below tunneling magneto-resistance elements TMR.

Note that the direction of the current flowing through power supply voltage lines PLa, PLb and ground lines GLa, GLb in FIG. 9 is the same as that in FIG. 13. Therefore, the power supply lines in the second arrangement example of the first modification of the first embodiment in FIG. 9 may be provided near memory array 2 with the structure of FIGS. 14A to 14G.

Second Embodiment

As described in "Description of the Background Art", in the MRAM device, the non-selected memory cells located on the same memory cell row as that of the selected memory cell is subjected only to a prescribed data write magnetic field of the hard-axis (HA) direction. Similarly, the non-selected memory cells located on the same memory cell column as that of the selected memory cell is subjected only to a prescribed data write magnetic field of the easy-axis (EA) direction.

In each tunneling magneto-resistance element TMR, free magnetic layer VL is magnetized in the direction according to the storage data level ("1" or "0") along the easy axis EA. Accordingly, the non-selected memory cells corresponding to the same bit line as that of the selected memory cell are most likely to be subjected to erroneous rewriting of the magnetization direction of free magnetic layer VL. In other words, the non-selected memory cells corresponding to the same bit line as that of the selected memory cell are most likely to be subjected to erroneous writing of the data.

Figure 42:
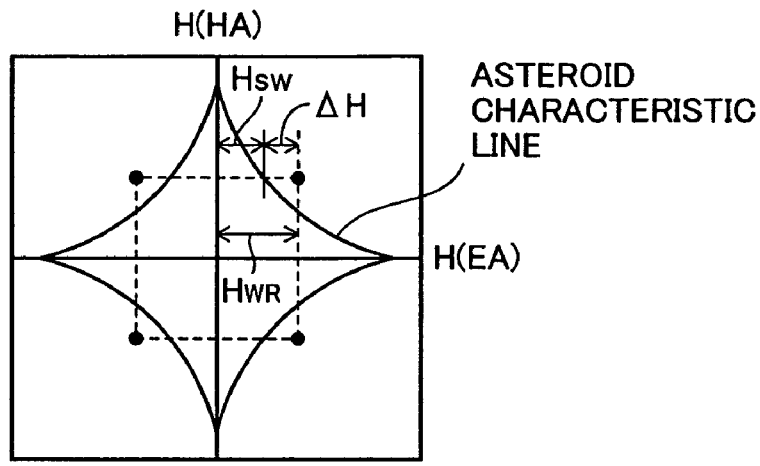
FIG. 42 is a conceptual diagram illustrating the relation between the data write current and the magnetization direction of a tunneling magneto-resistance element in data write operation to the MTJ memory cell.
Figure 43:
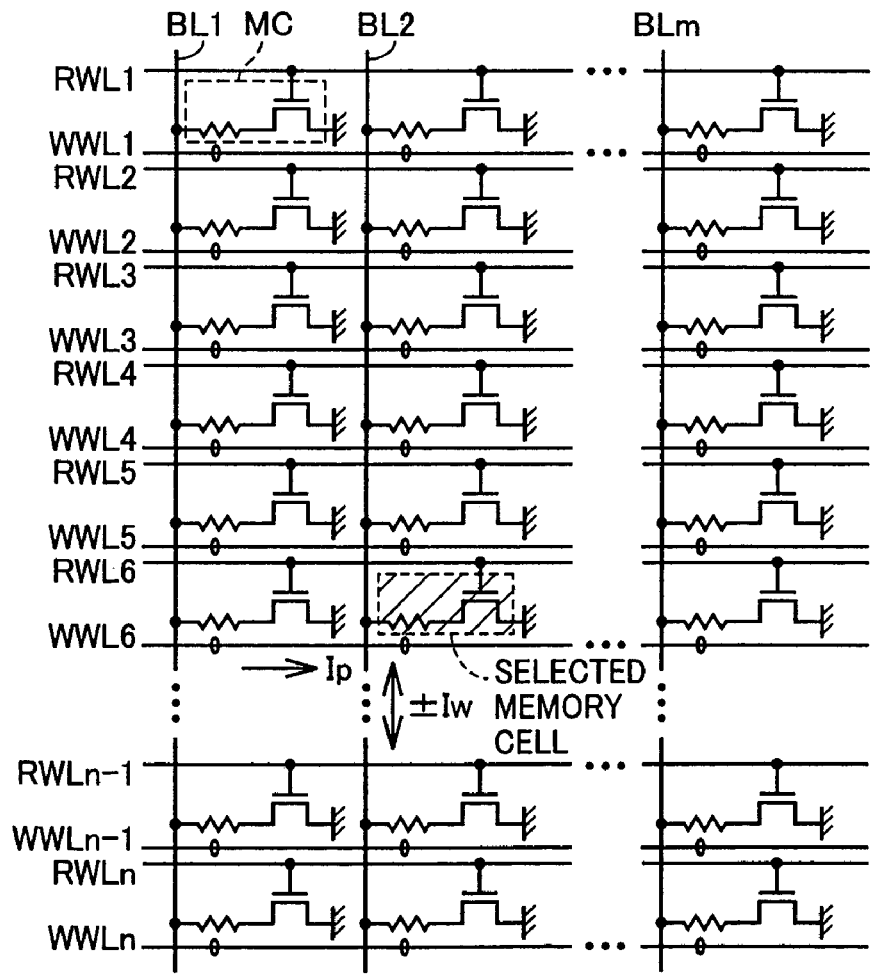
FIG. 43 is a conceptual diagram showing the array structure of MTJ memory cells arranged in a matrix in an integrated manner.

Such erroneous writing occurs when magnetic noise is applied to the non-selected memory cells of the selected column and the magnetic field of the hard-axis (HA) direction exceeds switching magnetic field strength HSW in FIG. 42. Accordingly, the magnetic noise of the hard-axis (HA) direction must be especially suppressed in memory array 2.

If the magnetic noises from, e.g., the power supply lines rotate the magnetization direction of free magnetic layer VL of the MTJ memory cell away from the easy-axis (EA) direction during data read operation or the like, the resistance value of tunneling magneto-resistance element TMR becomes equal to an intermediate value of R1 and R0. This causes reduction in read operation margin.

Figure 15:
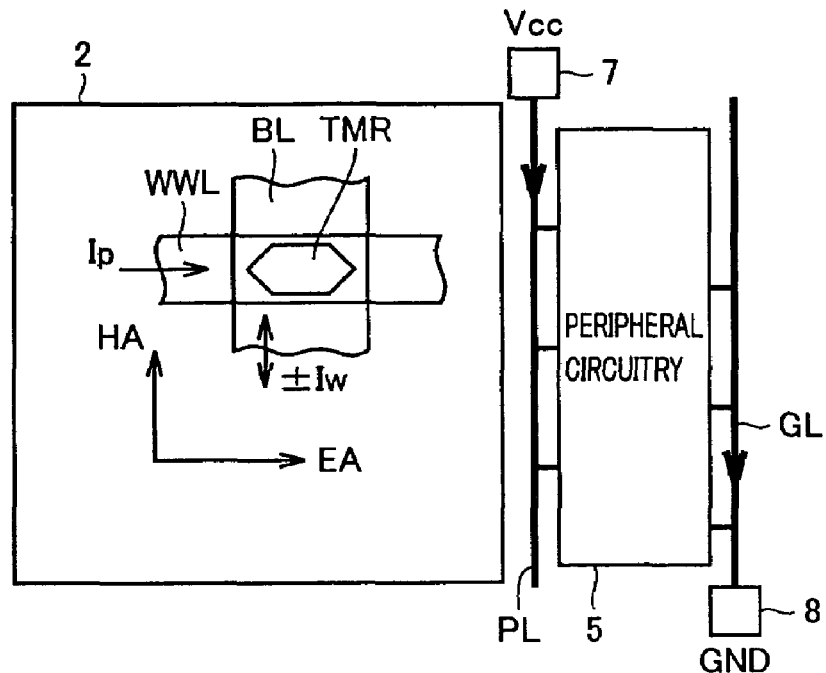
FIG. 15 is a block diagram showing a first arrangement example of the power supply lines according to a second embodiment of the present invention.

FIG. 15 is a block diagram showing a first arrangement example of the power supply lines according to the second embodiment of the present invention.

Referring to FIG. 15, write word lines WWL extend in the row direction and bit lines BL extend in the column direction in memory array 2. A data write magnetic field generated by data write current Ip flowing through write word line WWL is applied to tunneling magneto-resistance element TMR in the hard-axis (HA) direction. On the other hand, a magnetic field generated by data write current ±Iw flowing through bit line BL is applied to tunneling magneto-resistance element TMR in the easy-axis (EA) direction.

Power supply voltage line PL and ground line GL are provided for peripheral circuitry 5 corresponding to memory array 2. Power supply voltage line PL and ground line GL extend in the same direction as that of bit lines BL for generating a data write magnetic field of the easy-axis (EA) direction. Power supply voltage Vcc is supplied to power supply voltage line PL through power supply node 7. Ground voltage GND is supplied to ground line GL through ground node 8.

With the above structure, the magnetic fields generated by the currents flowing through power supply voltage line PL and ground line GL, that is, the magnetic noises from the power supply lines, are applied to memory array 2 in the easy-axis (EA) direction of tunneling magneto-resistance element TMR.

As a result, the magnetic noises of the hard-axis (HA) direction applied to the non-selected memory cells of the selected column are suppressed, thereby preventing erroneous writing caused by the magnetic noises generated from the power supply lines in data write operation.

In the operation other than data write operation as well, the magnetic noises that rotate the magnetization direction of free magnetic layer VL in magneto-resistance element TMR will not be applied to the MTJ memory cells. This prevents reduction in read operation margin caused by the magnetic noises from the power supply lines.

The second embodiment may be combined with the first embodiment and the modifications thereof in order to arrange the power supply lines so that the magnetic noises generated from power supply voltage line PL and ground line GL cancel each other in memory array 2. This enables suppression of the adverse effects of the magnetic noises from the power supply lines on the memory array.

Figure 16:
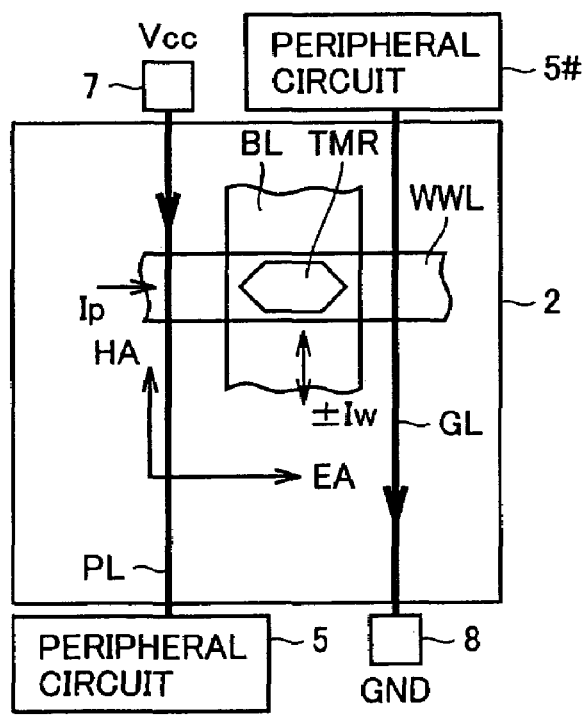
FIG. 16 is a block diagram showing a second arrangement example of the power supply lines according to the second embodiment.

FIG. 16 is a block diagram showing a second arrangement example of the power supply lines according to the second embodiment.

Referring to FIG. 16, the structure of FIG. 15 is applicable even when the power supply lines are provided above and/or below memory array 2 so as to extend across memory array 2.

In this arrangement example as well, the magnetic fields generated by the currents flowing through power supply voltage line PL and ground line GL are applied to memory array 2 in the easy-axis (EA) direction of tunneling magneto-resistance element TMR. As a result, the same effects as those of FIG. 15 can be obtained.

Modification of Second Embodiment

Figure 17:
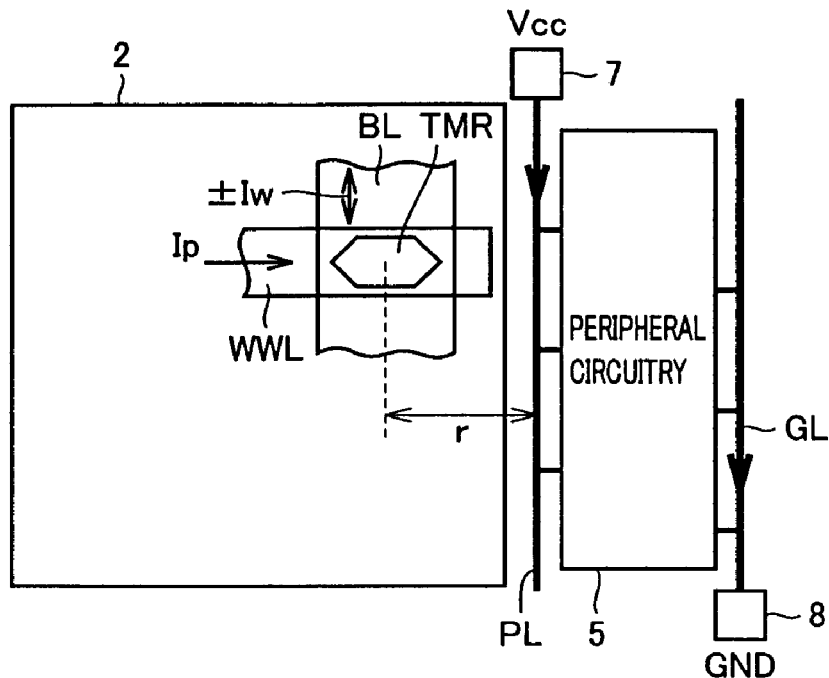
FIG. 17 is a block diagram showing a first arrangement example of the power supply lines according to a modification of the second embodiment.

FIG. 17 is a block diagram showing a first arrangement example of the power supply lines according to a modification of the second embodiment.

The modification of the second embodiment is different from the second embodiment in FIG. 15 in that the power supply lines are arranged so that the magnetic noises from the power supply lines have prescribed strength or less in memory array 2.

Referring to FIG. 17, the distance r from power supply voltage line PL to tunneling magneto-resistance element TMR in the nearest MTJ memory cell is determined in view of a peak current flowing through the power supply line. This perk current can be obtained by, e.g., circuit simulation at the time of design.

More specifically, provided that Ipeak is a peak current flowing through power supply voltage line PL, the magnetic noise corresponding to the peak current has peak strength Hpeak defined by the following expression (1), where k is a proportional constant:

$$H\text{peak} = k \cdot (I\text{peak}/r) \qquad (1).$$

Distance r is designed according to the following expression (2) so that peak strength Hpeak defined by the above expression (1) is smaller than prescribed strength hp that is determined in view of the magnetization characteristics of the MTJ memory cell:

$$H\text{peak} < hp \qquad (2).$$

Prescribed strength hp in the above expression (2) corresponds to margin $\Delta h$ in FIG. 42. Margin $\Delta h$ is commonly set to about 20% of switching magnetic field strength HSW. This prevents operation stability of the MRAM device from being impeded by the magnetic noises generated by the power supply lines.

Note that the structure of FIG. 17 is applied to each type of power supply line (power supply voltage line and ground line). In other words, the distance from ground line GL to tunneling magneto-resistance element TMR in the nearest MTJ memory cell is also designed similarly.

Figure 18:
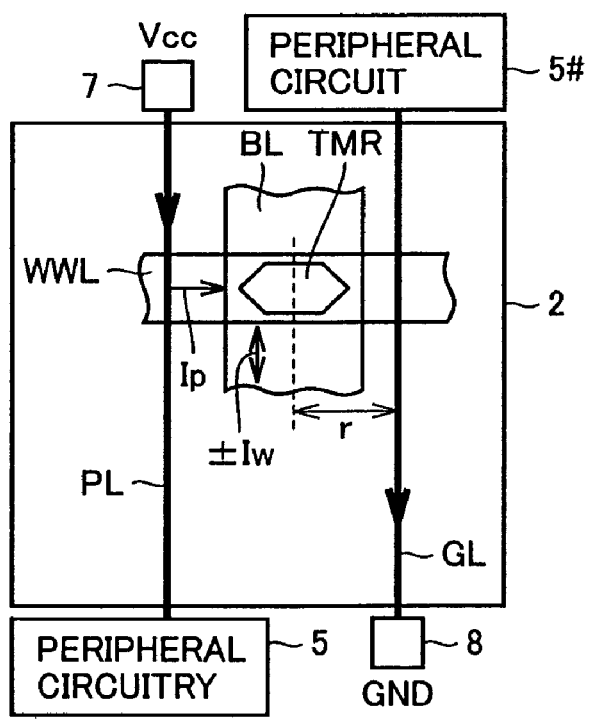
FIG. 18 is a block diagram showing a second arrangement example of the power supply lines according to the modification of the second embodiment.

FIG. 18 is a block diagram showing a second arrangement example of the power supply lines according to the modification of the second embodiment.

Referring to FIG. 18, the structure of FIG. 17 is applicable even when the power supply lines are provided above and/or below memory array 2 so as to extend across memory array 2.

In this case as well, arrangement of the power supply lines need only be designed according to the above expressions (1), (2) based on the distance r from each power supply line to the nearest tunneling magneto-resistance element TMR. The modification of the second embodiment may be combined with the first embodiment and the modifications thereof. This enables further suppression of the adverse effects of the magnetic noises from the power supply lines on memory array 2.

Note that, in FIGS. 17 and 18, the power supply lines are arranged so that the magnetic noises from the power supply lines are applied in the easy-axis (EA) direction of tunneling magneto-resistance element TMR. However, the modification of the second embodiment is not limited to this. The arrangement of the power supply lines may be designed based on the distance from the power supply line to the nearest tunneling magneto-resistance element TMR regardless of the extending direction of the power supply lines.

Third Embodiment

As described in the second embodiment, the magnetic noises from the power supply lines are maximized upon generation of a peak current. A decoupling capacitor is commonly provided for the power supply lines in order to suppress power supply variation. A high-frequency current such as peak current on the power supply line passes through the decoupling capacitor. The decoupling capacitor occupies a relatively large area because it must have a certain level of capacitance. Efficient arrangement of the decoupling capacitor is therefore important for reduced size and improved integration of the MRAM device.

Figure 19:
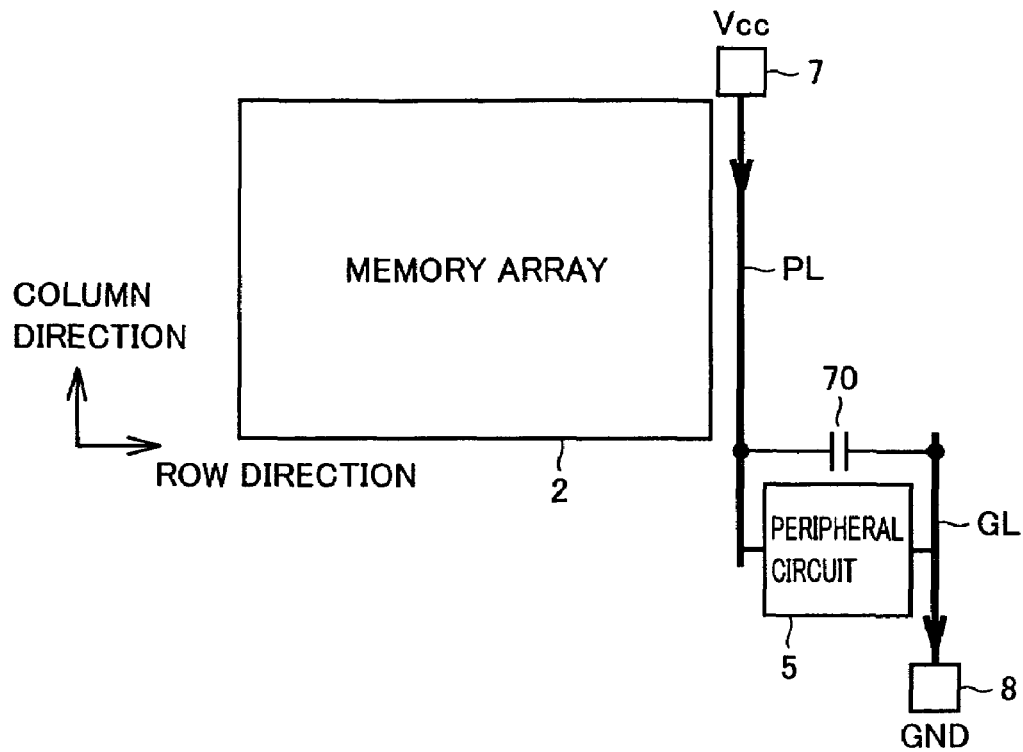
FIG. 19 is a block diagram showing a first arrangement example of a decoupling capacitor according to a third embodiment of the present invention.
Figure 20:
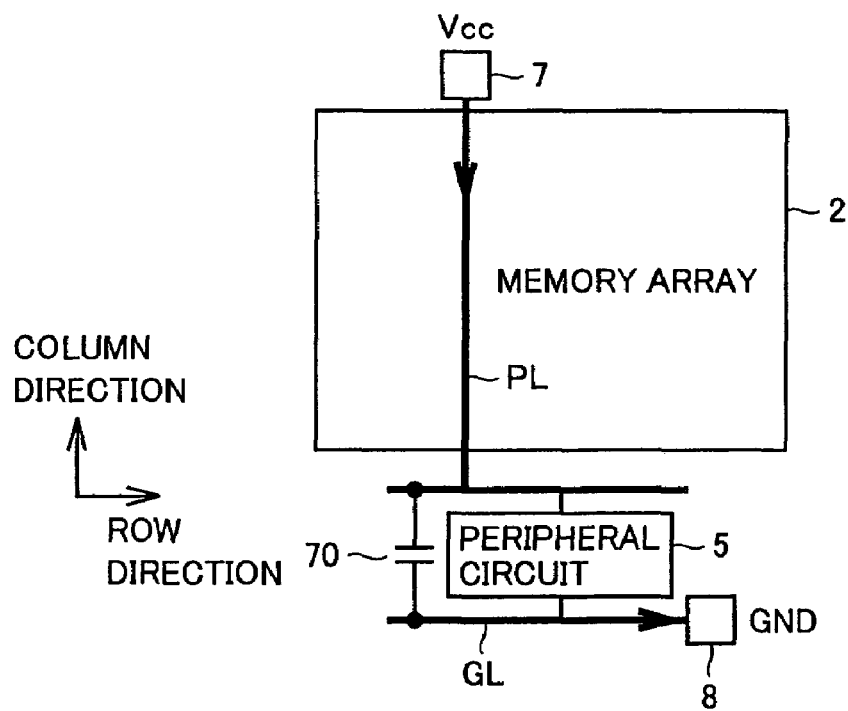
FIG. 20 is a block diagram showing a second arrangement example of the decoupling capacitor according to the third embodiment.

FIGS. 19 and 20 are block diagrams illustrating first and second arrangement examples of the decoupling capacitor according to the third embodiment of the present invention.

Referring to FIG. 19, power supply voltage line PL extends in, e.g., the column direction, and transmits power supply voltage Vcc from power supply node 7 to peripheral circuitry 5. Power supply node 7 and peripheral circuitry 5 face each other along the extending direction of power supply voltage line PL with memory array 2 interposed therebetween. Ground node 8 and ground line GL are provided on the same side as peripheral circuitry 5 with respect to memory array 2. Accordingly, power supply voltage line PL extends across the region between power supply node 7 and memory array 2, the region near memory array 2 and the region between memory array 2 and peripheral circuitry 5.

Decoupling capacitor 70 is electrically coupled between power supply voltage line PL and ground line GL in the region between memory array 2 and peripheral circuitry 5 rather than in the region near memory array 2. A peak current is generated on power supply voltage line PL in response to a current consumed by peripheral circuitry 5. This peak current is generated ahead of decoupling capacitor 70. Therefore, the peak current will not flow in the region near memory array 2. Efficient arrangement of the decoupling capacity thus enables further suppression of the magnetic noises from the power supply lines to memory array 2.

Power supply voltage line PL may extend in the direction other than the column direction. However, by providing power supply voltage line PL in the same direction as that of bit line BL, the power supply lines can be arranged in the same manner as that of the second embodiment. Therefore, the adverse effects of the magnetic noises from the power supply lines can be suppressed.

Referring to FIG. 20, the structure of FIG. 19 is applicable even when the power supply line is provided above or below memory array 2 so as to extend across memory array 2.

In this case as well, decoupling capacitor 70 is electrically coupled between power supply voltage line PL and ground line GL in the region between memory array 2 and peripheral circuitry 5 rather than in the region near memory array 2. As a result, the same effects as those in FIG. 19 can be obtained even when the power supply line extends across memory array 2.

First Modification of Third Embodiment

Figure 21:
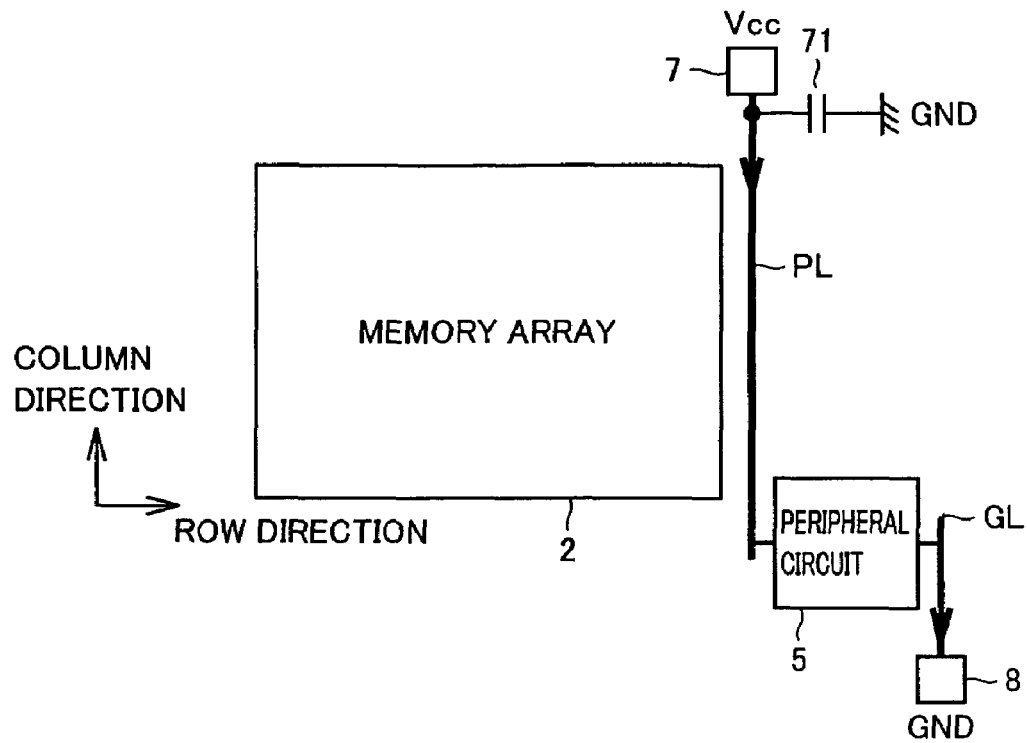
FIG. 21 is a block diagram showing a first arrangement example of a decoupling capacitor according to a first modification of the third embodiment.
Figure 22:
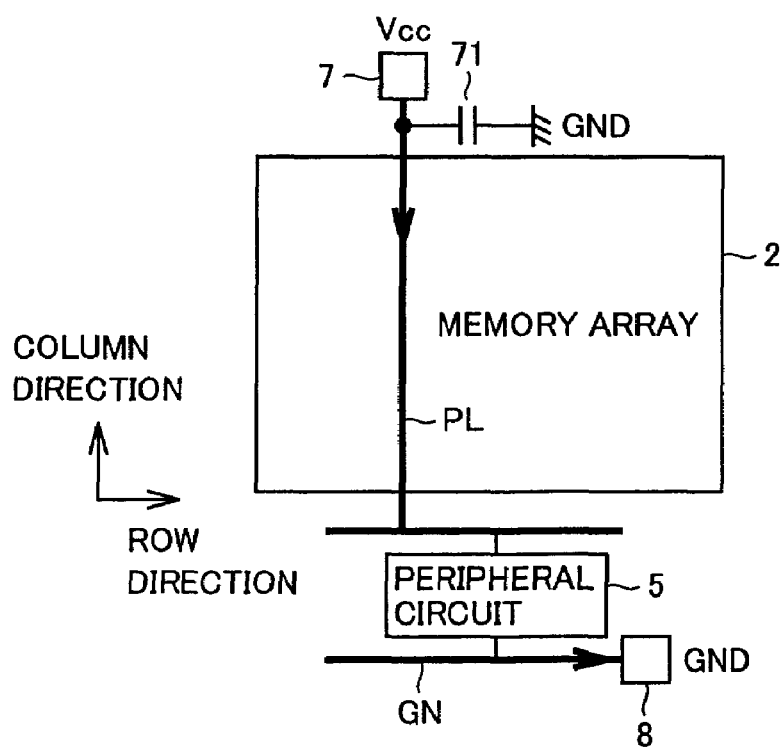
FIG. 22 is a block diagram showing a second arrangement example of the decoupling capacitor according to the first modification of the third embodiment.

FIGS. 21 and 22 are block diagrams showing first and second arrangement examples of the decoupling capacitor according to the first modification of the third embodiment.

Referring to FIG. 21, peripheral circuitry 5, power supply node 7, power supply voltage line PL, ground line GL and ground node 8 are arranged in the same manner as that of FIG. 19. Therefore, detailed description thereof will not be repeated.

In the first modification of the third embodiment, a decoupling capacitor 71 is provided on power supply voltage line PL in the region between power supply node 7 and memory array 2. Decoupling capacitor 71 is electrically coupled between power supply voltage line PL and ground line GL. With this structure, a peak current generated by the current consumed by peripheral circuitry 5 is removed by decoupling capacitor 71 without flowing through the region near memory array 2. Like the third embodiment, the first modification of the third embodiment enables further suppression of the adverse effects of the magnetic noises from the power supply lines on memory array 2.

Referring to FIG. 22, the structure of FIG. 21 is applicable even when the power supply line is provided above or below memory array 2 so as to extend across memory array 2.

In this case as well, decoupling capacitor 71 is provided on power supply voltage line PL in the region between power supply node 7 and memory array 2 rather than in the region near memory array 2. With this structure, the same effects as those in FIG. 21 can be obtained even when the power supply line extends across memory array 2.

Second Modification of Third Embodiment

Figure 23:
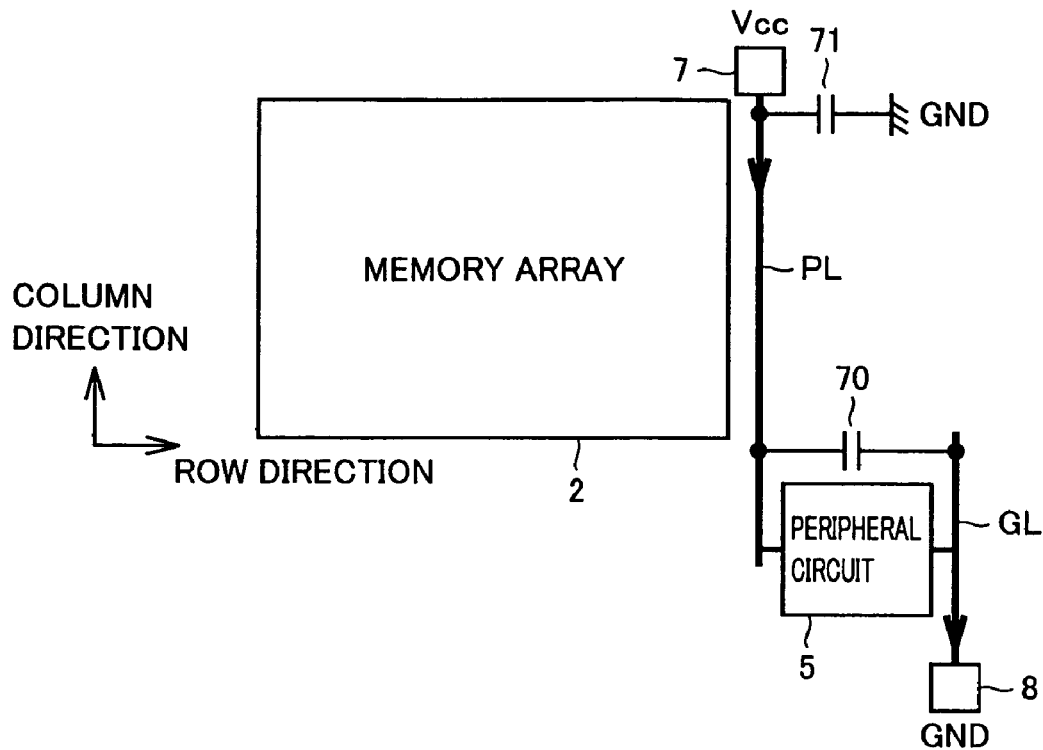
FIG. 23 is a block diagram showing a first arrangement example of decoupling capacitors according to a second modification of the third embodiment.
Figure 24:
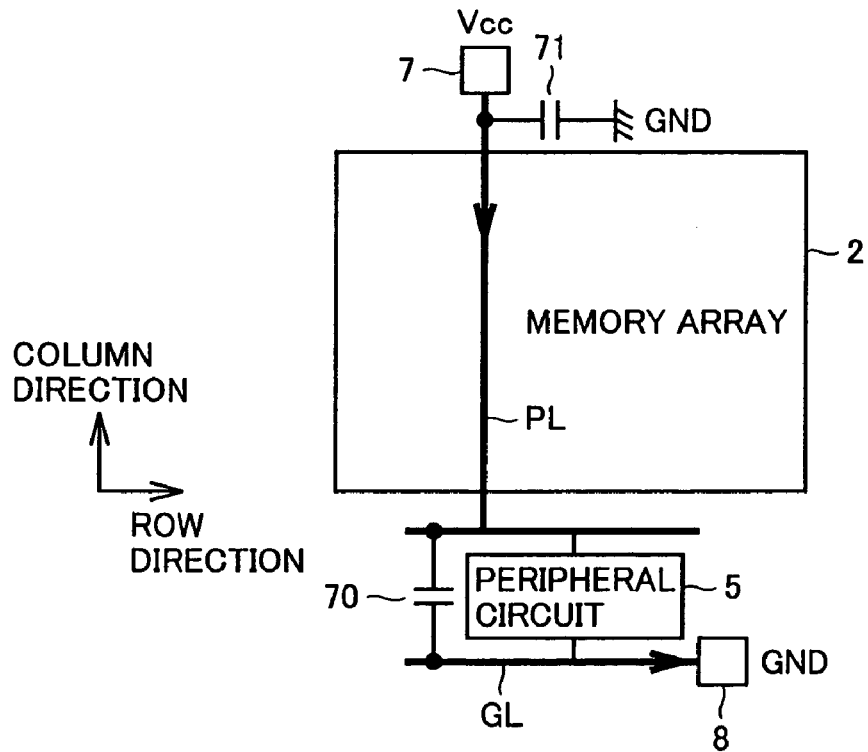
FIG. 24 is a block diagram showing a second arrangement example of the decoupling capacitors according to the second modification of the third embodiment.

FIGS. 23 and 24 are block diagrams showing first and second arrangement examples of the decoupling capacitors according to the second modification of the third embodiment.

Referring to FIG. 23, in the second modification of the third embodiment, the decoupling capacitors of the third embodiment and the first modification thereof are arranged in combination. More specifically, in the example of FIG. 23, both decoupling capacitors 70, 71 in FIGS. 19 and 20 are provided. This arrangement is designed when there is a relatively large margin in the layout of the MRAM device. This structure enables further suppression of the magnetic noise from power supply voltage line PL to memory array 2.

Similarly, in the example of FIG. 24, the power supply line is provided above or below memory array 2 so as to extend across memory array 2, and decoupling capacitors 70, 71 in FIGS. 20, 22 are provided. This structure enables further suppression of the magnetic noise from the power supply line to memory array 2.

Note that the arrangement of the decoupling capacitor (or capacitors) according to the third embodiment and the first and second modifications thereof is applicable to the power supply lines arranged according to the first embodiment, the second embodiment and the modifications of the first and second embodiments. In this case, the effects of the above embodiments and modifications can also be obtained. Therefore, the adverse effects of the magnetic noises from the power supply lines on the MTJ memory cells are more strongly removed, enabling stable operation of the MRAM device.

Fourth Embodiment

Figure 25:
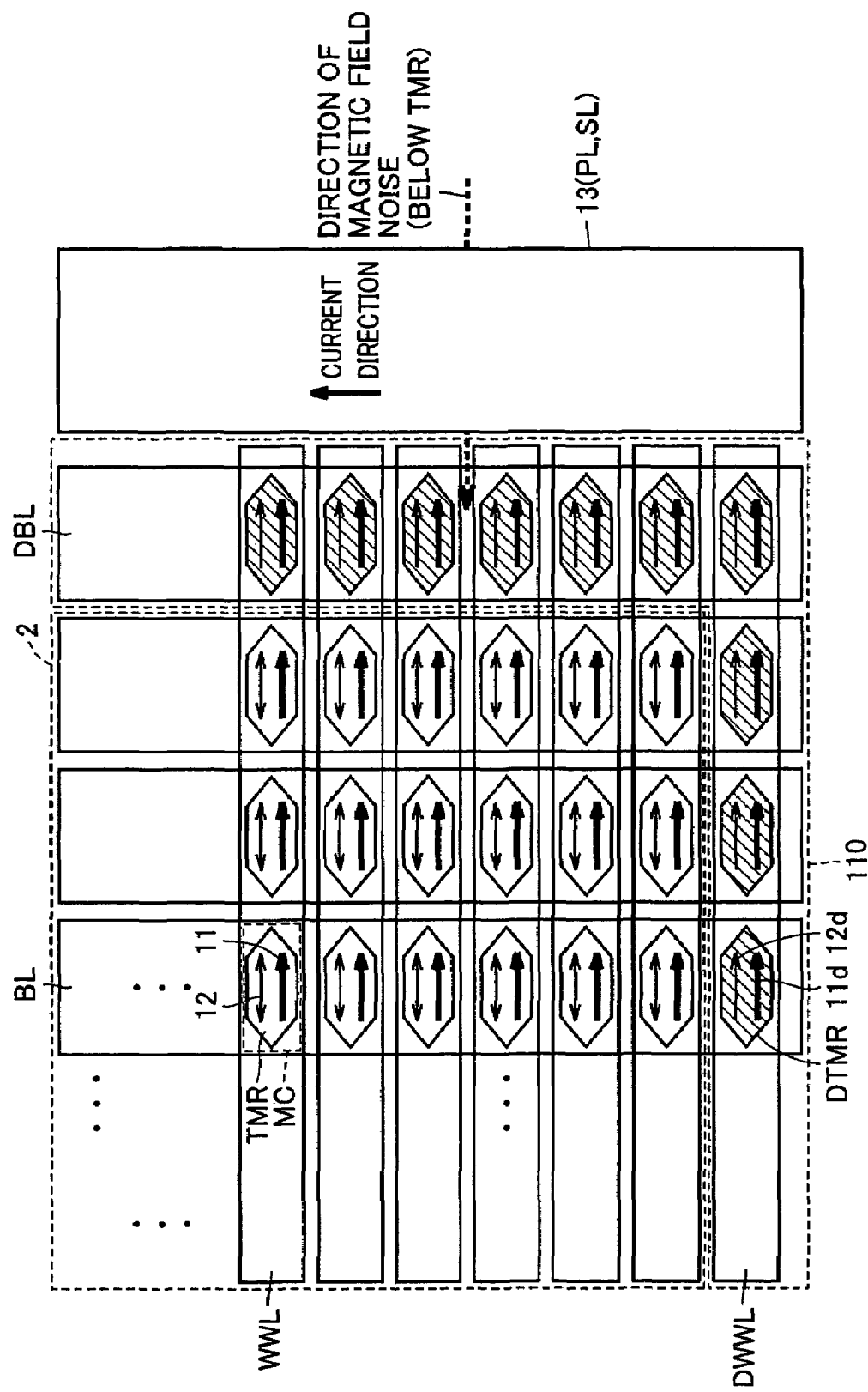
FIG. 25 is a conceptual diagram showing the structure around a memory array according to a fourth embodiment of the present invention.

Referring to FIG. 25, in the fourth embodiment, a plurality of dummy, magneto-resistance elements DTMR are arranged in a peripheral region 110 at the end of memory array 2 where a plurality of memory cells MC are arranged. Dummy magneto-resistance elements DTMR are arranged in a row or column along at least one of the memory cell rows and memory cell columns.

Figure 40:
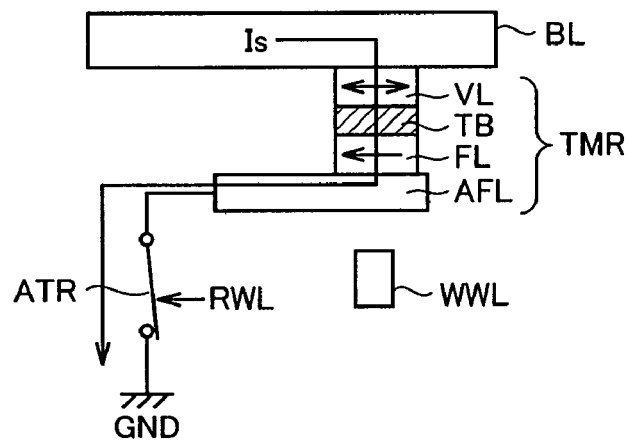
FIG. 40 is a conceptual diagram illustrating data read operation from the MTJ memory cell.
Figure 41:
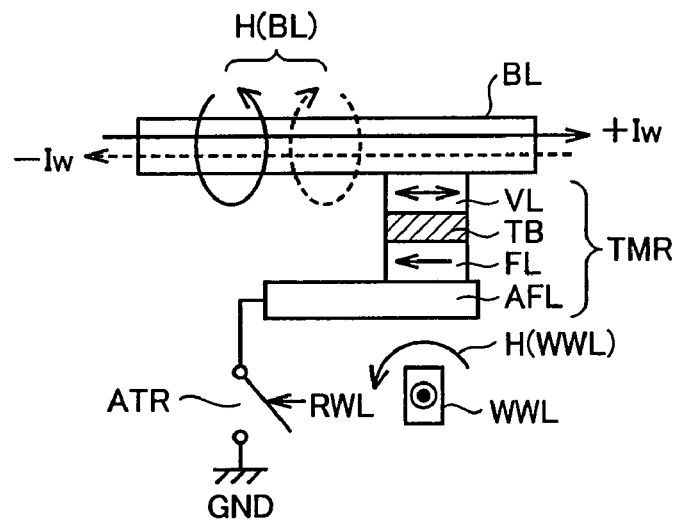
FIG. 41 is a conceptual diagram illustrating data write operation to the MTJ memory cell.

Each dummy magneto-resistance element DTMR has the same shape and structure as those of tunneling magneto-resistance element TMR in memory cell MC. More specifically, like the structure in FIGS. 40 and 41, tunneling magneto-resistance element TMR and dummy magneto-resistance element DTMR each has a fixed magnetic layer FL having a fixed magnetization direction, a free magnetic layer VL having a magnetization direction rewritable by an applied magnetic field, and an antiferromagnetic material layer AFL for fixing the magnetization direction of fixed magnetic layer FL.

As described before, in memory cell MC, fixed magnetic layer FL has a fixed magnetization direction 11, and free magnetic layer VL has a magnetization direction 12 rewritable by a data write magnetic field according to the write data level. In dummy magneto-resistance element DTMR, however, magnetization direction $12d$ of free magnetic layer VL is the same as magnetization direction $11d$ of fixed magnetic layer FL. These magnetization directions $11d$, $12d$ are preset so as to cancel the magnetic field generated by a wiring 13 located nearest to dummy magneto-resistance elements DTMR.

For example, wiring 13 located close to dummy magneto-resistance elements DTMR may be a power supply line such as power supply voltage line PL and ground line GL. Since these wirings are commonly formed in the topmost layer of the chip, tunneling magneto-resistance elements TMR and dummy magneto-resistance elements DTMR would be formed in a layer located below wiring 13. Accordingly, a magnetic field from wiring 13 is applied to dummy magneto-resistance elements DTMR in the direction shown by dashed line in FIG. 25 (i.e., to the left in FIG. 25). Therefore, magnetization directions $11d$, $12d$ of dummy magneto-resistance element DTMR are preset to the opposite direction (i.e., to the right in FIG. 25).

This structure reduces the magnetic noises applied from wiring 13 (such as power supply line) provided in the peripheral region of memory array 2 to memory cells MC in memory array 2. As a result, operation stability of each memory cell MC is improved.

Since magnetization direction 11 of the fixed magnetic layer in memory cell MC is the same as magnetization directions $11d$ (fixed magnetic layer) and $12d$ (free magnetic layer) of dummy magneto-resistance element DTMR, dummy magneto-resistance elements DTMR can be magnetized simultaneously in the process of magnetizing free magnetic layers FL of memory cells MC. In other words, a separate magnetizing process is not required for dummy magneto-resistance elements DTMR.

Moreover, dummy magneto-resistance elements DTMR arranged at the end of the memory array prevent the magnetic field from becoming discontinuous at the end of the memory array. Therefore, the operation margin of memory cells MC arranged at the end region of the memory array will not be degraded. Moreover, dummy magneto-resistance elements DTMR have the same shape and structure as those of tunneling magneto-resistance elements TMR. Therefore, dummy magneto-resistance elements DTMR can be manufactured together with tunneling magneto-resistance elements TMR. In other words, a separate manufacturing process is not required for dummy magneto-resistance elements DTMR.

Moreover, the structure of the fourth embodiment prevents discontinuity of the shape at the end of memory array 2. Therefore, tunneling magneto-resistance elements TMR at the end of memory array 2 will have a uniform shape. In order to ensure continuity of the shape of the wirings, a dummy write word line DWWL corresponding to write word line WWL, and a dummy bit line DBL corresponding to bit line BL are provided for dummy magneto-resistance elements DTMR that need not be written selectively.

Modification of Fourth Embodiment

Figure 26:
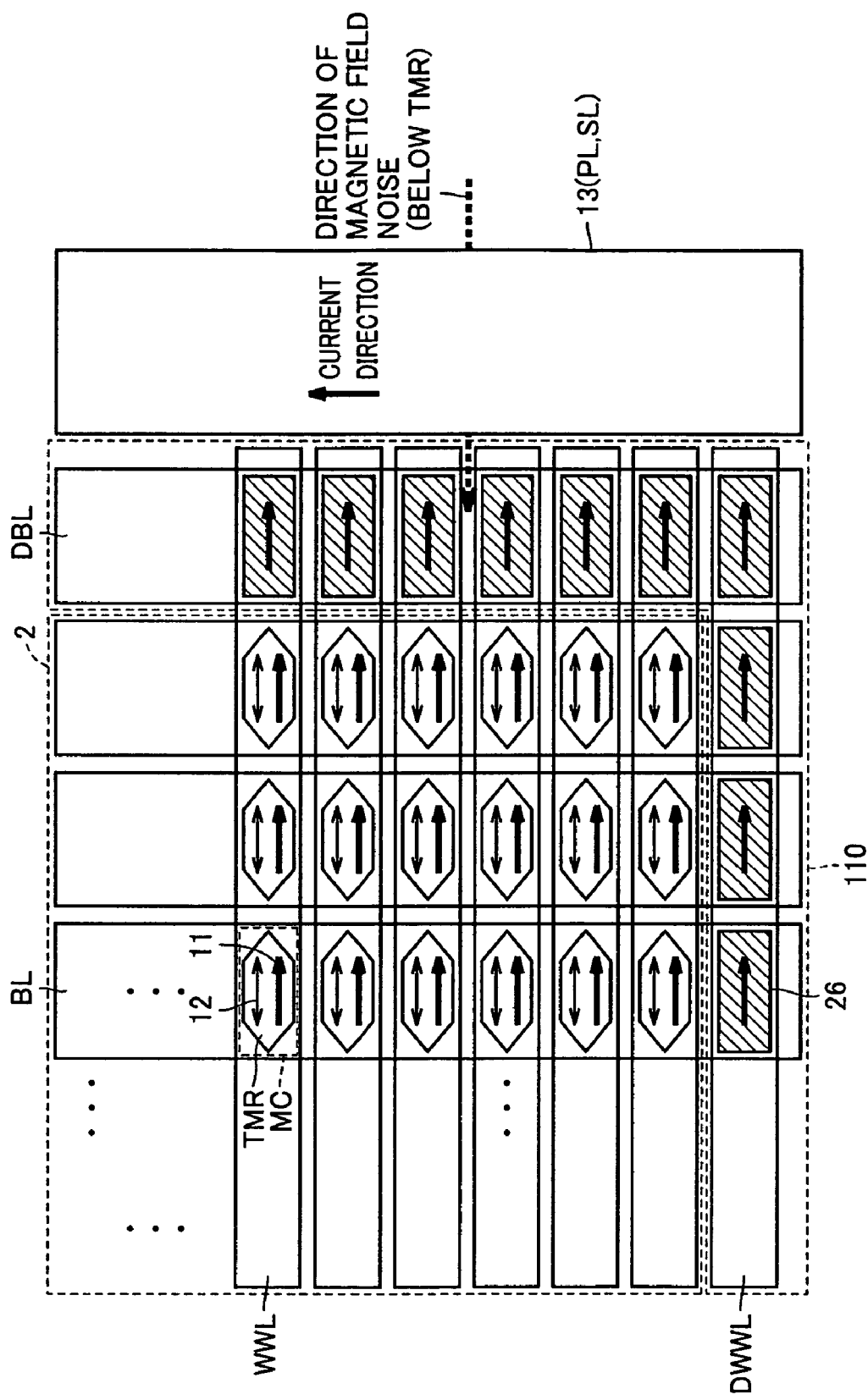
FIG. 26 is a conceptual diagram showing the structure around the memory array according to a modification of the fourth embodiment.

Referring to FIG. 26, the modification of the fourth embodiment is different from the fourth embodiment in that dummy magneto-resistance elements DTMR provided in peripheral region 110 at the end of memory array 2 are replaced with dummy magnetic elements 26. Dummy magnetic elements 26 include magnetic elements having a fixed magnetization direction. However, dummy magnetic elements 26 do not have the same shape and structure as those of tunneling magneto-resistance element TMR in memory cell MC. For example, a magnetic element corresponding to antiferromagnetic material layer AFL in tunneling magneto-resistance element TMR may be used as dummy magnetic element 26. Accordingly, the same effects as those of the fourth embodiment can be obtained even when dummy magnetic elements 26 having a different shape and structure from those of tunneling magneto-resistance elements TMR are provided in the peripheral region. More specifically, the modification of the fourth embodiment also reduces the magnetic noises applied from wiring 13 (such as power supply line) provided in the peripheral region of memory array 2 to memory cells MC in memory array 2. As a result, operation stability of each memory cell MC is improved.

Fifth Embodiment

Figure 27:
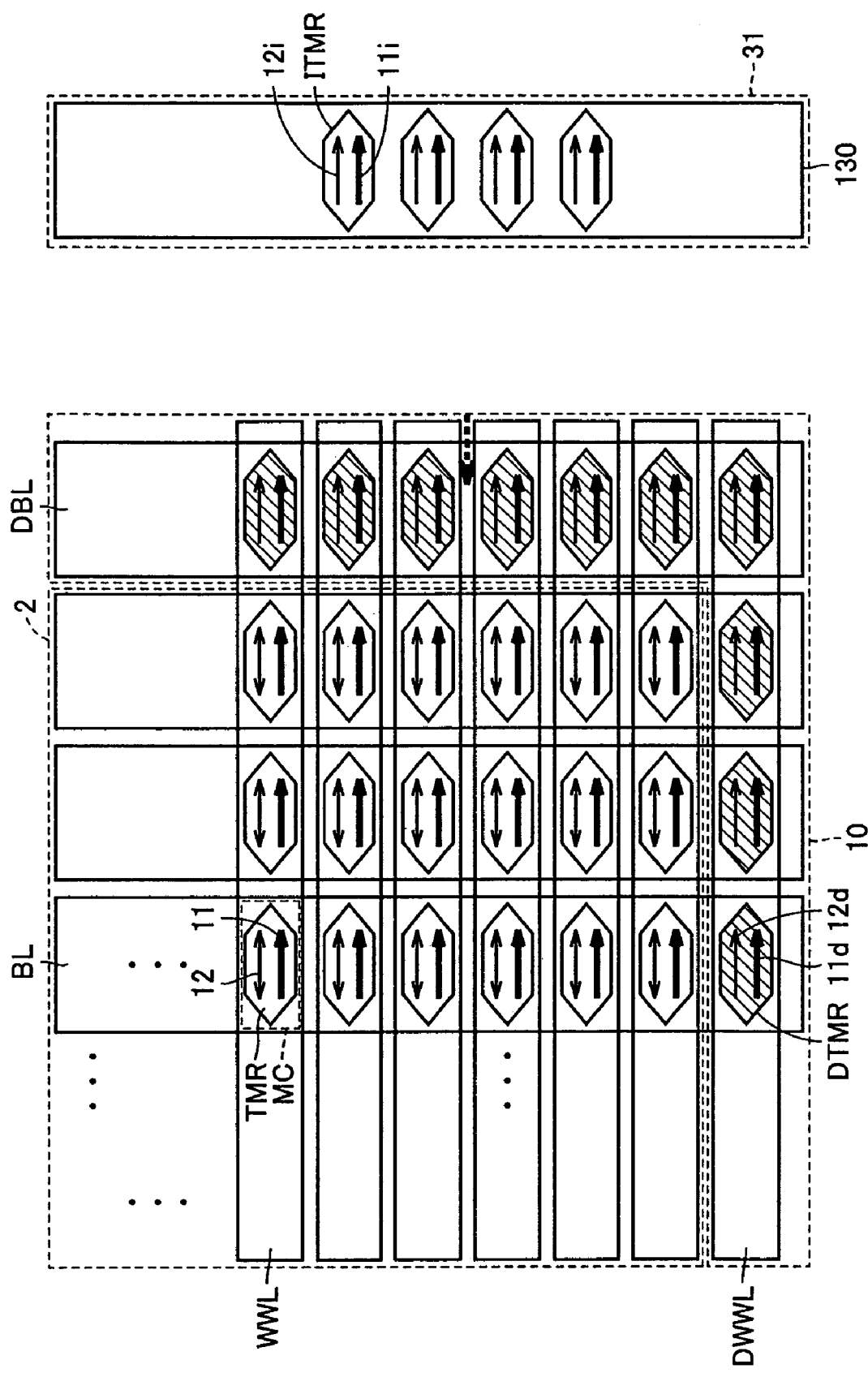
FIG. 27 is a conceptual diagram showing the structure around a memory array according to a fifth embodiment of the present invention.

Referring to FIG. 27, in the fifth embodiment, a wiring 130 for forming an inductance element is provided in a region outside memory array 2. For example, wiring 130 is provided at peripheral circuitry. 5. As in the fourth embodiment and the modification thereof, dummy magneto-resistance elements DTMR or dummy magnetic elements 26 may be provided in peripheral region 110 at the end of memory array 2. This reduces the magnetic noise applied to memory cells MC in memory array 2. Wiring 130 is electrically coupled to magnetic elements ITMR having the same shape and structure as those of tunneling magneto-resistance element TMR in memory cell MC.

Figure 28:
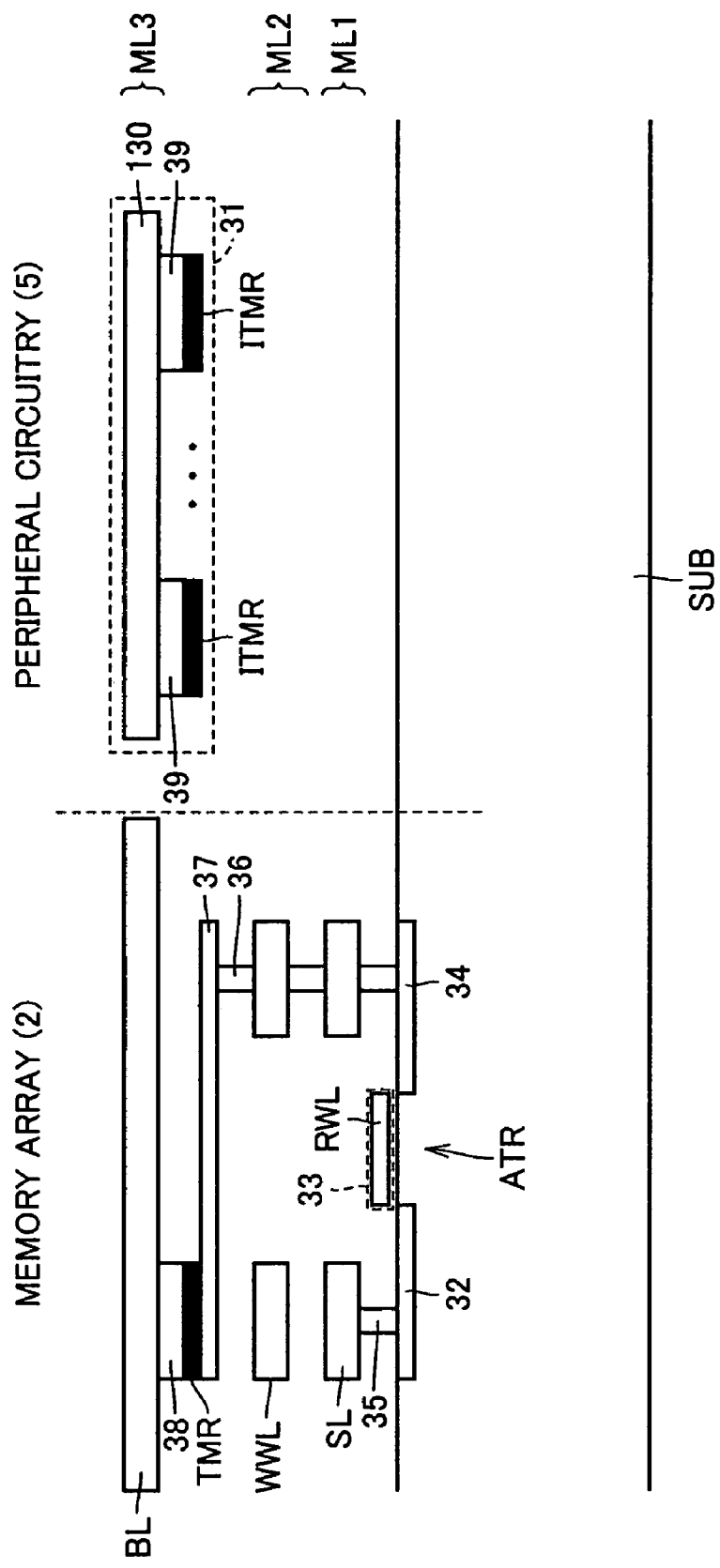
FIG. 28 is a cross-sectional view illustrating the structure of an inductance element in FIG. 27.

FIG. 28 is a cross-sectional view illustrating the structure of the inductance element. For comparison, FIG. 28 shows a cross-sectional view of memory cell MC in memory array 2 and a cross-sectional view of wiring 130 at peripheral circuitry 5.

Referring to FIG. 28, in memory array 2, an access transistor ATR is formed on a semiconductor substrate SUB. Access transistor ATR has source/drain regions (n-type regions) 32, 34 and a gate 33. Source/drain region 32 is electrically coupled to a reference voltage line SL through a metal film formed in a contact hole 35. A read word line RWL is provided as a wiring for connecting gates 33 to each other in a gate layer.

A write word line WWL is formed in a metal wiring layer located above reference voltage line SL. Tunneling magneto-resistance element TMR is provided in a layer located above write word line WWL. Tunneling magneto-resistance element TMR is electrically coupled to source/drain region 34 of access transistor ATR through a strap 37 and a metal film formed in a contact hole 36. Strap 37 is provided in order to electrically couple tunneling magneto-resistance element TMR to access transistor ATR, and is formed from a conductive material. A bit line BL is electrically coupled to tunneling magneto-resistance element TMR, and is formed in a layer located above tunneling magneto-resistance element TMR.

In peripheral circuitry 5, wiring 130 formed in the same wiring layer as that of bit line BL is electrically coupled to magnetic elements ITMR through a metal film formed in a contact hole 39. Magnetic elements ITMR are formed in the same layer as that of tunneling magneto-resistance elements TMR in memory array 2, and have the same shape and structure as those of tunneling magneto-resistance element TMR. Accordingly, magnetic elements ITMR can be manufactured simultaneously in the manufacturing process of memory cells MC. In other words, a separate manufacturing process is not required for magnetic elements ITMR.

Referring back to FIG. 27, in magnetic elements ITMR connected to wiring 130, magnetization direction $11i$ of the fixed magnetic layer is the same as magnetization direction $12i$ of the free magnetic layer. These magnetization directions $11i$, $12i$ are the same as magnetization direction 11 of the fixed magnetic layer in tunneling magneto-resistance element TMR. This eliminates the need for a separate process of magnetizing magnetic elements ITMR.

An inductance element 31 formed by wiring 130 and at least one magnetic element ITMR coupled thereto can be used as a circuit element. Alternatively, inductance element 31 may be connected in series with a power supply line for supplying an operating voltage. In this case, inductance element 31 can be used to suppress a peak current such as inrush current generated upon power-on.

A current flowing through wiring 130 of inductance element 31 is preset so that the magnetic field generated by this current is smaller than a threshold value for rewriting magnetization direction $12i$ of the free magnetic layer in magnetic element ITMR. As a result, the inductance value of inductance element 31 can be retained stably.

Sixth Embodiment

In the sixth embodiment, preferred arrangement of power supply lines and wirings receiving a data write current will be described.

Figure 29:
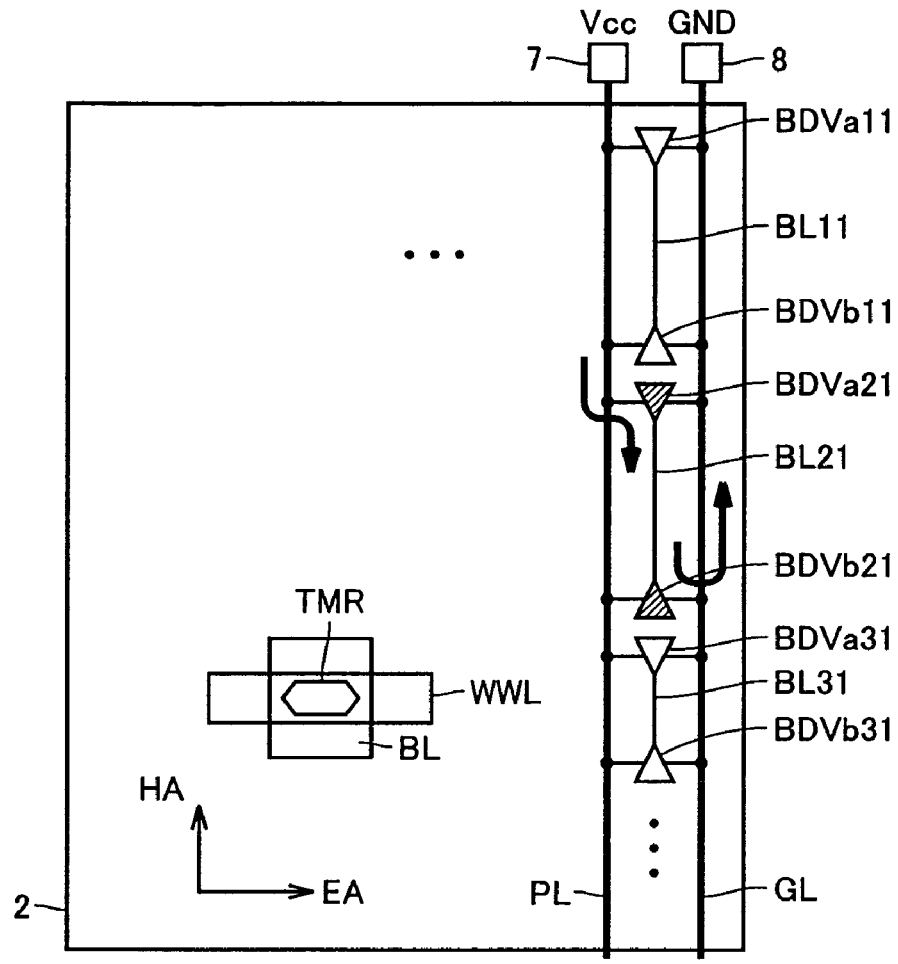
FIG. 29 is a conceptual diagram showing the arrangement of bit lines and power supply lines according to a sixth embodiment of the present invention.

FIG. 29 is a conceptual diagram showing the arrangement of bit lines and power supply lines according to the sixth embodiment.

Referring to FIG. 29, bit lines BL and write word lines WWL are provided for memory cells MC arranged in a matrix in memory array 2. Bit lines BL are provided corresponding to the memory cell columns, and write word lines WWL are provided corresponding to the memory cell rows. As described before, a data write current for generating a magnetic field along the easy-axis direction of tunneling magneto-resistance element TMR is applied to bit line BL. A data write current for generating a magnetic field along the hard-axis direction of tunneling magneto-resistance element TMR is applied to write word line WWL. In other words, bit lines BL extend along the hard-axis direction HA of tunneling magneto-resistance element TMR, and write word lines WWL extend along the easy-axis direction EA of tunneling magneto-resistance elements TMR. Bit line BL is divided into a plurality of bit lines in each memory cell column. For example, bit lines BL11, BL21, BL31 . . . are provided in the first memory cell column.

A set of power supply voltage line PL and ground line GL are provided for a plurality of bit lines in each memory cell column. Power supply voltage line PL and ground line GL extend parallel to bit lines BL. Power supply voltage line PL and ground line GL are shared by bit lines BL11, BL21, BL31 . . . that are located adjacent to each other in the longitudinal direction. One end of power supply voltage line PL is electrically coupled to power supply node 7 for supplying power supply voltage Vcc. One end of ground line GL is electrically coupled to ground node 8 for supplying ground voltage GND. Bit lines BL for applying a data write magnetic field to the selected memory cell are formed closer to tunneling magneto-resistance elements TMR than are power supply voltage line PL and ground line GL for supplying a data write current to bit line BL.

A bit line driver is provided at both ends of each bit line BL. For example, bit line drivers BDVa11, BDVb11 are provided at both ends of bit line BL11. Bit line drivers BDVa21, BDVb21 are provided at both ends of bit line BL21. Bit line drivers BDVa31, BDVb31 are provided at both ends of bit line BL31. Hereinafter, bit line drivers BDVa11, BDVa21, BDVa31 . . . provided at one ends of bit lines BL are sometimes generally referred to as bit line drivers BDVa. Similarly, bit line drivers BDVb11 BDVb21, BDVb31 . . . provided at the other ends of bit lines BL are sometimes generally referred to as bit line drivers BDVb.

Figure 30:
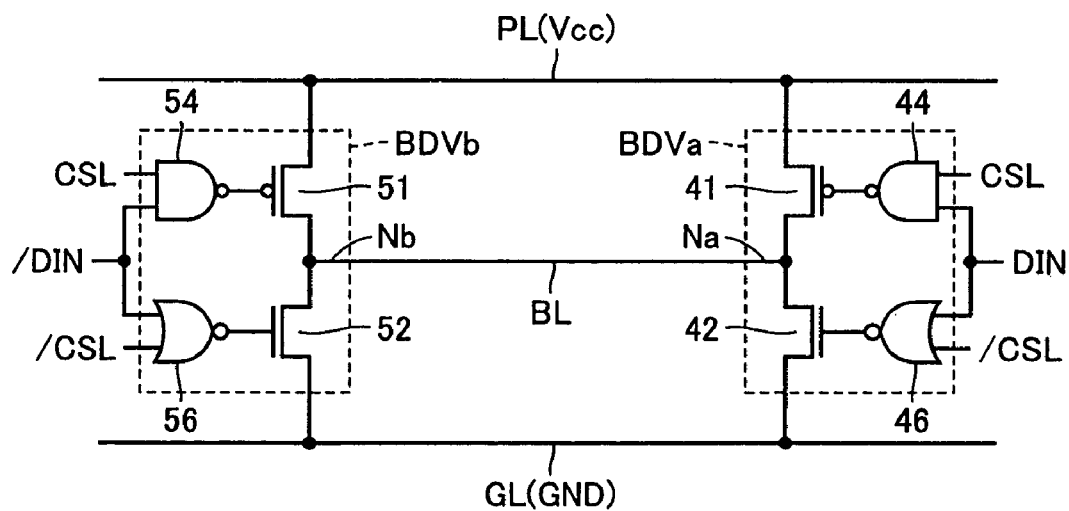
FIG. 30 is a circuit diagram showing the structure of bit line drivers in FIG. 29.

Referring to FIG. 30, bit line driver BDVa has a P-channel MOS (Metal Oxide Semiconductor) transistor 41, an N-channel MOS transistor 42, and logic gates 44, 46. P-channel MOS transistor 41 is electrically coupled between a node Na (which corresponds to one end of bit line BL) and power supply voltage line PL. N-channel MOS transistor 42 is electrically coupled between node Na and ground line GL. Logic gate 44 outputs the NAND operation result of the level of a corresponding column selection line CSL and write data DIN. Logic gate 46 outputs the NOR operation result of write data DIN and inverted level/CSL of a corresponding column selection line. The output of logic gate 44 is applied to the gate of transistor 41, and the output of logic gate 46 is applied to the gate of transistor 42. Column selection line CSL is activated to H level when a corresponding memory cell column is selected. Otherwise, column selection line CSL is inactivated to L level.

Bit line driver BDVb has a P-channel MOS transistor 51, an N-channel MOS transistor 52, and logic gates 54, 56. P-channel MOS transistor 51 is electrically coupled between a node Nb (which corresponds to the other end of bit line BL) and power supply voltage line PL. N-channel MOS transistor 52 is electrically coupled between node Nb and ground line GL. Logic gate 54 outputs the NAND operation result of the level of a corresponding column selection line CSL and inverted write data/DIN. Logic gate 56 outputs the NOR operation result of inverted write data/DIN and inverted level/CSL of a corresponding column selection line. The output of logic gate 54 is applied to the gate of transistor 51, and the output of logic gate 56 is applied to the gate of transistor 52.

Bit line drivers BDVa, BDVb are activated in the selected column (column selection line CSL is at H level). According to the level of write data DIN, activated bit line driver BDVa selectively connects one of power supply voltage line PL and ground line GL to node Na, and activated bit line driver BDVb selectively connects the other to node Nb.

In the non-selected columns (column selection lines CSL are at L level), bit line drivers BDVa are inactivated and do not connect node Na to power supply voltage line PL and ground line GL. Moreover, bit line drivers BDVb are also inactivated and do not connect node Nb to power supply voltage line PL and ground line GL.

Referring back to FIG. 29, it is now assumed that a memory cell corresponding to bit line BL21 is selected for data write operation, and a data write current is applied in the direction from bit line driver BDVa21 to bit line driver BDVb21 according to the data write level.

In this case, bit line drivers BDVa21, BDVb21 are activated, and the remaining bit line drivers are inactivated. Accordingly, the data write current flows from power supply node 7 to ground node 8 through power supply voltage line PL (in the region corresponding to bit line BL1), bit line driver BDVa21, bit line BL21, bit line driver BDVb21, and ground line GL (in the regions corresponding to bit line BL21 and bit line BL11).

In the region corresponding to bit line BL11, a current flows in the opposite directions in power supply voltage line PL and ground line GL. Therefore, as described in connection with FIGS. 10A, 10B, magnetic fields applied from the power supply lines to tunneling magneto-resistance elements TMR cancel each other. In other words, power supply voltage line PL and ground line GL of the same set may either be formed horizontally adjacent to each other in the same wiring layer as shown in FIG. 10A, or formed in different wiring layers so as to vertically overlap each other as shown in FIG. 10B.

The direction of the data write current flowing through bit line BL21 is opposite to that of the current flowing through ground line GL in the region corresponding to bit line BL21. Therefore, the magnetic fields applied from these currents to the non-selected memory cells cancel each other. In the regions corresponding to the following bit lines BL31 . . . , no current flows through bit line BL, power supply voltage line PL and ground line GL. Therefore, no magnetic noise will be generated.

The above structure reduces the magnetic noises applied from the wirings included in the path of the data write current supplied to bit line BL of the selected column to the non-selected memory cells, thereby improving operation reliability of the MRAM device.

First Modification of Sixth Embodiment

In the first modification of the sixth embodiment, the structure for simplifying the bit line driver will be described.

Figure 31:
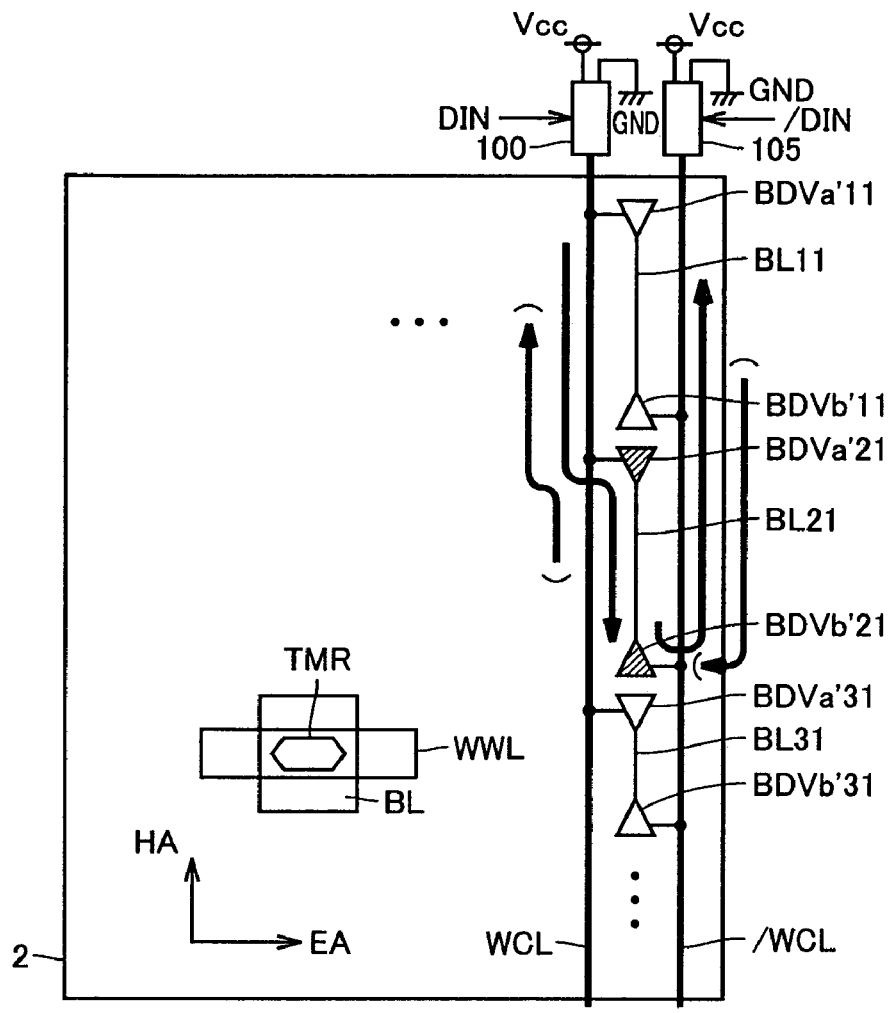
FIG. 31 is a conceptual diagram showing the arrangement of bit lines and power supply lines according to a first modification of the sixth embodiment.

Referring to FIG. 31, in the first modification of the sixth embodiment, power supply voltage line PL and ground line GL are replaced with write current lines WCL, /WCL. A power supply switch circuit 100 is provided for write current line WCL, and a power supply switch circuit 105 is provided for write current line/WCL. Power supply switch circuit 100 connects one of power supply voltage Vcc and ground voltage GND to write current line WCL according to write data DIN. Power supply switch circuit 105 connects the other voltage to write current line/WCL according to inverted write data level/DIN. Accordingly, write current lines WCL, /WCL are respectively connected to power supply voltage Vcc and ground voltage GND, or ground voltage GND and power supply voltage Vcc, in a complementary manner according to write data DIN.

Bit line drivers BDVa11 to BDVa31 . . . in the sixth embodiment are replaced with bit line drivers BDVa'11 to BDVa'31 . . . , and bit line drivers BDVb11 to BDVb31 . . . are replaced with bit line drivers BDVb'11 to BDVb'31 . . . Hereinafter, bit line drivers BDVa'11 to BDVa'31 . . . are sometimes generally referred to as bit line drivers BDVa', and bit line drivers BDVb'11 to BDVb'31 . . . are sometimes generally referred to as bit line drivers BDVb'. Since the structure of the first modification of the sixth embodiment is otherwise the same as that of the sixth embodiment in FIG. 29, detailed description thereof will not be repeated.

Figure 32:
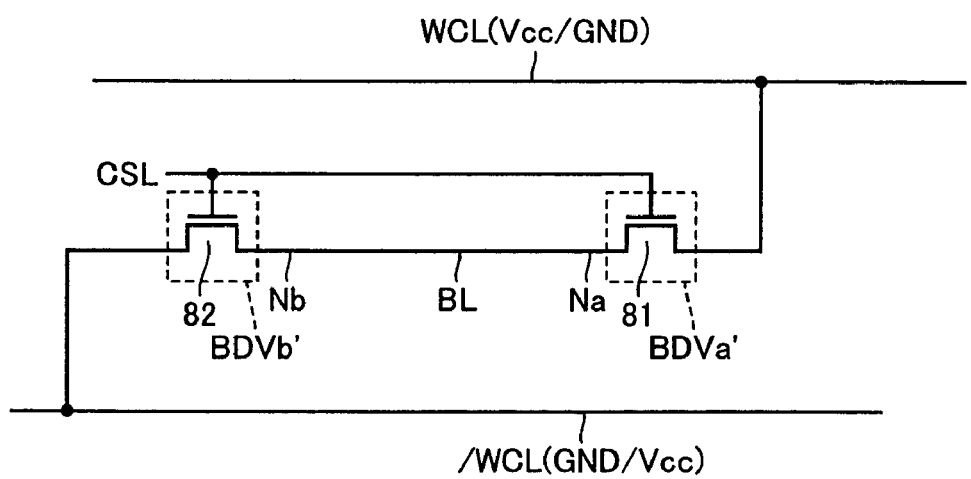
FIG. 32 is a circuit diagram showing the structure of bit line drivers in FIG. 31.

FIG. 32 is a circuit diagram showing the structure of the bit line drivers in FIG. 31.

Referring to FIG. 32, bit line driver BDVa' has an N-channel MOS transistor 81 electrically coupled between write current line WCL and node Na (one end of bit line BL). Bit line driver BDVb' has an N-channel MOS transistor 82 electrically coupled between node Nb (the other end of bit line BL) and write current line/WCL. Transistors 81, 82 have their respective gates connected to a corresponding column selection line CSL.

In the first modification of the sixth embodiment, power supply switch circuits 100, 105 selectively connect write current lines WCL, /WCL to power supply voltage Vcc and ground voltage GND. This eliminates the need for bit line drivers BDVa', BDVb' to select between write current lines WCL, /WCL according to the write data level. In other words, the above structure allows each bit line driver BDVa', BDVb' to fixedly select either write current line WCL or /WCL. Accordingly, each bit line driver can be formed only from a transistor gate, whereby the structure of the bit line drivers is simplified. As a result, the circuit area is reduced, and the chip having the MRAM device mounted thereon is reduced in size.

Referring back to FIG. 31, it is now assumed that a memory cell corresponding to bit line BL21 is selected for data write operation, and a data write current is applied in the direction from bit line driver BDVa'21 toward bit line driver BDVb'21 according to the write data level. In this case, the current flows through write current lines WCL, /WCL and selected bit line BL21 in the same direction as that of the current flowing through power supply voltage line PL, ground line GL and selected bit line BL21 in FIG. 29, respectively. When the write data has the opposite level, power supply switch circuits 100, 105 reverse the connection between write current lines WCL, /WCL and power supply voltage Vcc and ground voltage GND. Therefore, the current flows through write current lines WCL, /WCL and selected bit line BL21 in the opposite direction.

Like the sixth embodiment, the structure of the first modification of the sixth embodiment thus reduces the magnetic noises applied from the wirings included in the path of the data write current supplied to bit line BL of the selected column to the non-selected memory cells. As a result, operation reliability of the MRAM device can be improved.

Second Modification of Sixth Embodiment

In the second modification of the sixth embodiment, power supply line PL and ground line GL of the sixth embodiment are connected to a power supply node and a ground node at both ends.

Figure 33:
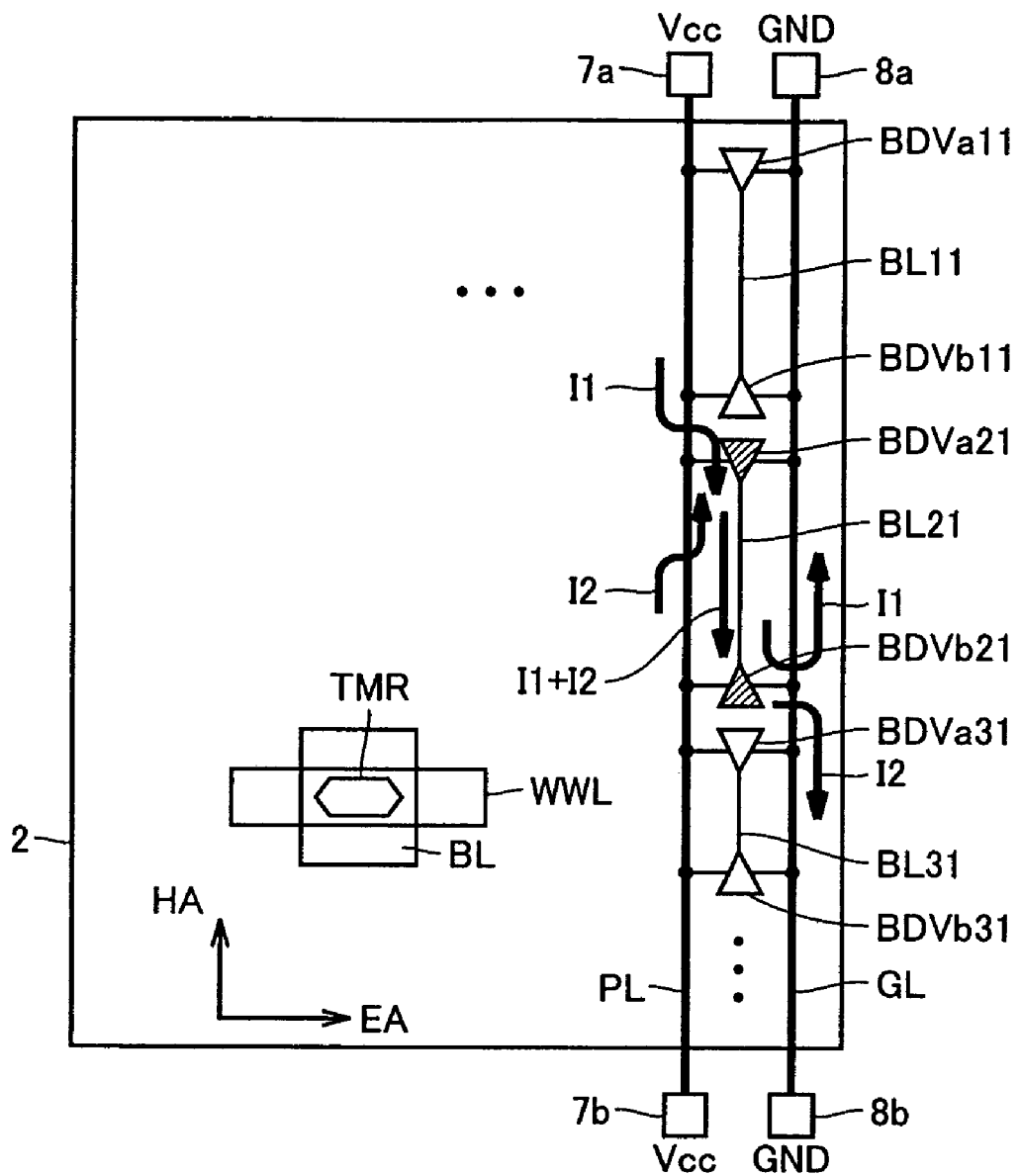
FIG. 33 is a conceptual diagram showing the arrangement of bit lines and power supply lines according to a second modification of the sixth embodiment.

Referring to FIG. 33, the second modification of the sixth embodiment is different from the sixth embodiment in that both ends of power supply voltage line PL are respectively connected to power supply nodes 7a, 7b for supplying power supply voltage Vcc, and both ends of ground line GL are respectively connected to ground nodes 8a, 8b for supplying ground voltage GND. Since the structure of the second modification of the sixth embodiment is otherwise the same as that of the sixth embodiment in FIG. 29, detailed description thereof will not be repeated.

In FIG. 33 as well, it is assumed that a memory cell corresponding to bit line BL21 is selected for data write operation, and a data write current is applied in the direction from bit line driver BDVa21 to bit line driver BDVb21. In this case, the sum of a current I1 from power supply node 7a and a current I2 from power supply node 7b, that is, (I1+I2), flows through bit line BL21 as a data write current. On ground line GL, the data write current (I1+I2) is divided into a current I1 to ground node 8a and a current I2 to ground node 8b.

In the region corresponding to bit line BL11, current I1 of the same level flows in the opposite directions in power supply voltage line PL and ground line GL. In the regions corresponding to bit lines BL31 . . . , current I2 of the same level flows in the opposite directions in power supply voltage line PL and ground line GL. Accordingly, the magnetic noises having about the same strength are generated from the above regions of power supply voltage line PL and ground line GL. These magnetic noises cancel each other in the memory cells MC.

Third Modification of Sixth Embodiment

In the third modification of the sixth embodiment, a power supply switch circuit is provided at both ends of each write current line WCL, /WCL described in the first modification of the sixth embodiment. In other words, the power supply switch circuits are provided in the same manner as that of the power supply nodes and the ground nodes described in the second modification of the sixth embodiment.

Figure 34:
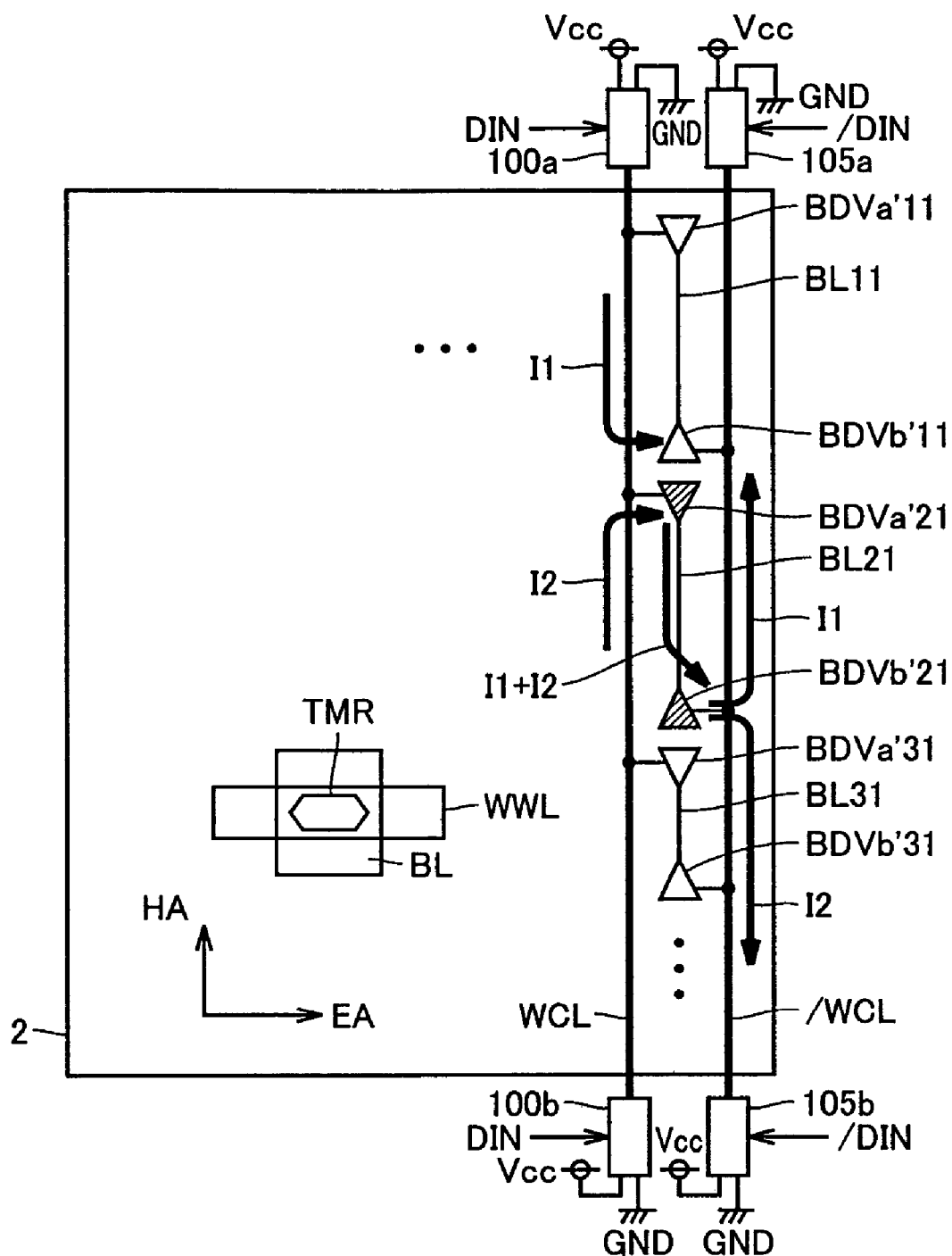
FIG. 34 is a conceptual diagram showing the arrangement of bit lines and power supply lines according to a third modification of the sixth embodiment.

Referring to FIG. 34, the third modification of the sixth embodiment is different from the first modification of the sixth embodiment in FIG. 31 in that power supply switch circuits 100a, 100b are respectively provided at the ends of write current line WCL and power supply switch circuits 105a, 105b are respectively provided at the ends of write current line/WCL. Power supply switch circuits 100a, 100b operate in the same manner as that of power supply switch circuit 100, and power supply switch circuits 105a, 105b operate in the same manner as that of power supply switch circuit 105. Accordingly, write current line WCL is equivalent to one of power supply voltage line PL and ground line GL in FIG. 33 (i.e., power supply voltage line PL having both ends coupled to power supply voltage Vcc and ground line GL having both ends coupled to ground voltage GND), and write current line/WCL is equivalent to the other.

In addition to the same effects as those of the second modification of the sixth embodiment, the third modification of the sixth embodiment simplifies the structure of bit line drivers BDVa', BDVb', thereby achieving a reduced chip area.

Fourth Modification of Sixth Embodiment

In the fourth modification of the sixth embodiment, each set of power supply voltage line PL and ground line GL corresponds to a plurality of memory cell columns.

Figure 35:
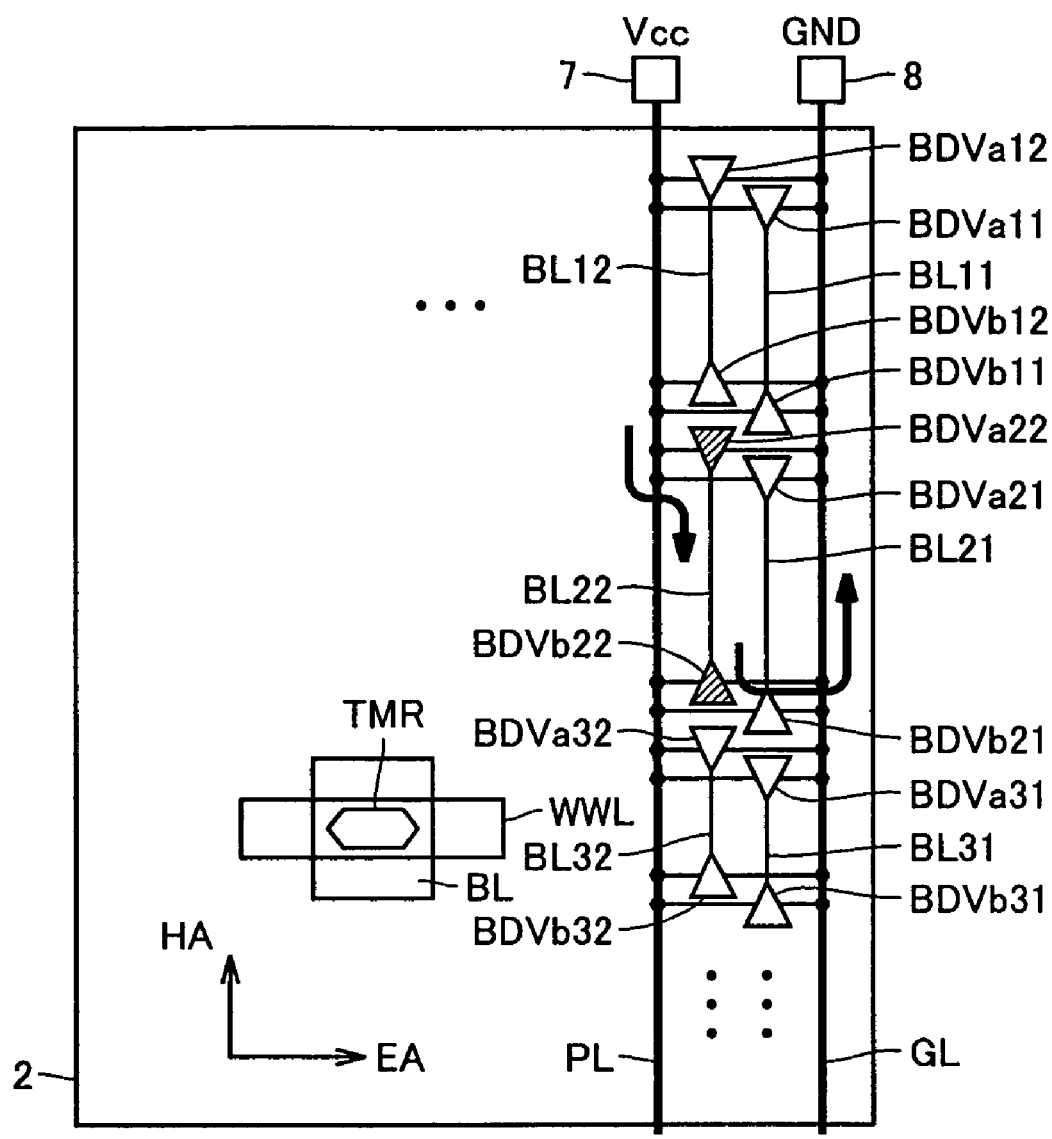
FIG. 35 is a conceptual diagram showing the arrangement of bit lines and power supply lines according to a fourth modification of the sixth embodiment.

Referring to FIG. 35, in the fourth modification of the sixth embodiment, a set of power supply voltage line PL and ground line GL are provided for every plurality of memory cell columns. For example, in FIG. 35, a set of power supply voltage line PL and ground line GL are provided for every two memory cell columns. Bit lines BL11 to BL31 . . . BL12 to BL32 . . . correspond to the set of power supply voltage line PL and ground line GL shown in FIG. 35. Bit line drivers BDVa11, BDVb11 to BDVa31, BDVb31 . . . and BDVa12, BDVb12 to BDVa32, BDVb32 . . . respectively correspond to bit lines BL11 to BL31 . . . , BL12 to BL32 . . . Bit line drivers BDVa11, BDVb11 to BDVa31, BDVb31 . . . and BDVa12, BDVb12 to BDVa32, BDVb32 . . . receive a data write current from common power supply voltage line PL and common ground line GL. In other words, power supply voltage line PL and ground line GL can be shared not only by the bit lines adjacent to each other in the longitudinal direction but also by the bit lines adjacent to each other in the width direction.

This structure reduces the number of power supply voltage lines PL and ground lines GL while reducing the magnetic noises as in the sixth embodiment.

The structure of the fourth modification of the sixth embodiment is also applicable to the first to third modifications of the sixth embodiment. In other words, a set of power supply voltage line PL and ground line GL may be provided for every plurality of memory cell columns in the first to third modifications of the sixth embodiment. Bit line BL need not necessarily be divided into a plurality of bit lines in each memory cell column.

In the structures of FIGS. 29, 33, 34 and the like, a current source circuit for supplying a constant current may be provided between power supply node 7, 7a, 7b and power supply voltage line PL so that power supply voltage Vcc is supplied to power supply voltage line PL through the current source circuit. This enables a data write current to be retained stably at a prescribed level.

The arrangement of power supply voltage line PL and ground line GL for supplying a data write current to bit line BL is shown in the sixth embodiment and the modifications thereof. However, the same structure is also applicable to the arrangement of power supply voltage line PL and ground line GL for supplying a data write current to write word line WWL. Note that the data write current is supplied to write word line WWL in the fixed direction regardless of the write data level. Therefore, for example, one end of each write word line WWL is connected to ground line GL, and a transistor switch is provided at the other end of write word line WWL in order to connect power supply voltage line PL and the other end of write word line WWL according to the row selection result.

Seventh Embodiment

In the seventh embodiment, effective arrangement of the power supply lines with respect to memory array 2 will be described.

Figure 36:
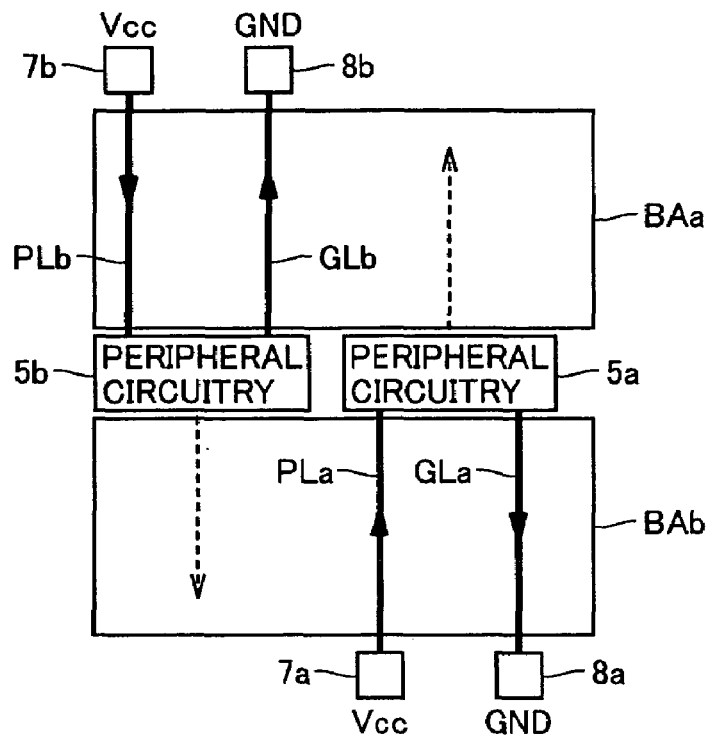
FIG. 36 is a block diagram illustrating a first arrangement example of power supply lines according to a seventh embodiment of the present invention.

Referring to FIG. 36, in a first arrangement example of the seventh embodiment, the memory array having a plurality of memory cells arranged therein as shown in FIG. 1 and the like is divided into banks BAa, BAb. A peripheral circuitry 5a is provided for bank BAa, and a peripheral circuitry 5b is provided for bank BAb. It is herein assumed that only one of banks BAa, BAb is selected for data write operation. In other words, banks BAa, BAb will not be simultaneously selected for data write operation.

A power supply voltage line PLa and a ground line GLa for supplying power supply voltage Vcc and ground voltage GND to peripheral circuitry 5a are provided in a region corresponding to bank BAb. In other words, a power supply node 7a and a ground node 8a are provided on the bank BAb side of peripheral circuitry 5a.

Similarly, a power supply voltage line PLb and a ground line GLb for supplying power supply voltage Vcc and ground voltage GND to peripheral circuitry 5b are provided in a region corresponding to bank BAa. In other words, a power supply node 7b and a ground node 8b are provided on the bank BAa side of peripheral circuitry 5b.

During data write operation to bank BAa, magnetic noises are generated from power supply voltage line PLa and ground line GLa supplying a data write current. However, these magnetic noises are generated only in the region corresponding to bank BAb where data write operation is not being conducted. Therefore, such magnetic noises that reduce the write operation margin will not be applied to bank BAa during data write operation thereto.

Similarly, during data write operation to bank BAb, magnetic noises are generated from power supply voltage line PLb and ground line GLb supplying a data write current. However, these magnetic noises are generated only in the region corresponding to bank BAa where data write operation is not being conducted. Therefore, such magnetic noises that reduce the write operation margin will not be applied to bank BAb during data write operation thereto.

Therefore, the structure of the seventh embodiment prevents the data from being erroneously written to the non-selected memory cells during data write operation, thereby improving operation reliability of the MRAM device.

Figure 37:
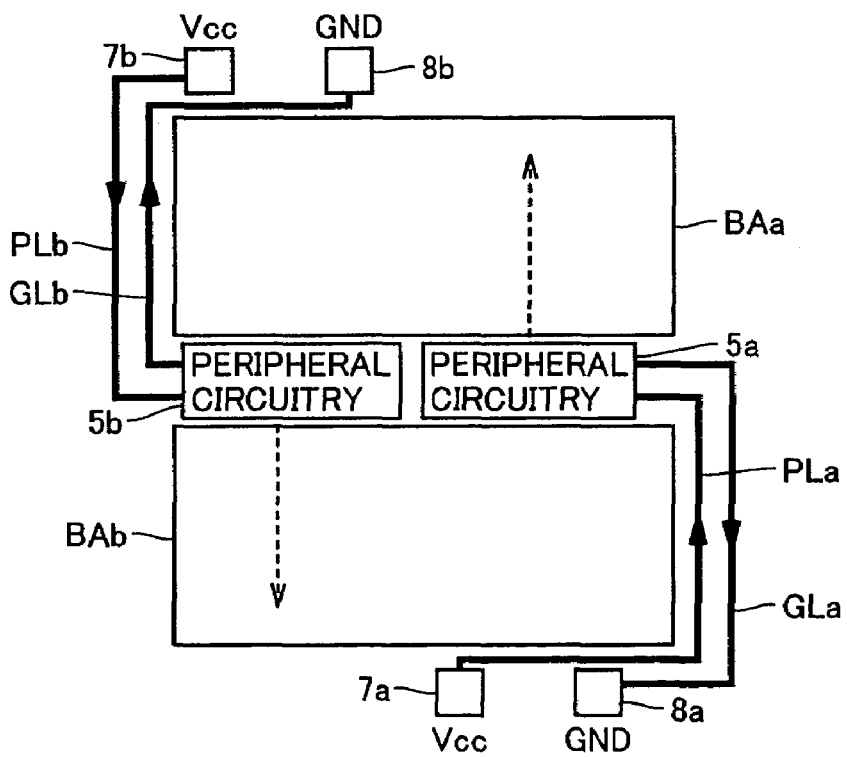
FIG. 37 is a block diagram illustrating a second arrangement example of power supply lines according to the seventh embodiment.

FIG. 37 is a block diagram showing a second arrangement example of the power supply voltages according to the seventh embodiment.

Referring to FIG. 37, power supply voltage line PLa and ground line GLa for supplying an operating voltage to peripheral circuitry 5a may be provided in the vicinity of bank BAb. Similarly, power supply voltage line PLb and ground line GLb for supplying an operating voltage to peripheral circuitry 5b may be provided in the vicinity of bank BAa. This structure also prevents the data from being erroneously written to the non-selected memory cells during data write operation, as in the case of FIG. 36. As a result, operation reliability of the MRAM device is improved.

Note that, in FIGS. 36 and 37, the memory array is divided into two banks that are complementarily selected for data write operation. However, the present invention is not limited to this. In other words, the memory array may be divided into three or more banks. In this case as well, the power supply lines corresponding to each bank are provided in a region corresponding to a bank (or banks) other than the corresponding bank and a bank that may be written simultaneously with the corresponding bank. With this structure, the same effects as those of the seventh embodiment can be obtained.

The arrangement of power supply lines is not limited to that shown in FIGS. 36 and 37. The power supply lines may alternatively be arranged according to the first to third embodiments and the modifications thereof.

Eighth Embodiment

The MRAM device is required to have two types of wirings for applying a data write magnetic field to the memory cells (in the present embodiment, bit lines BL and write word lines WWL). In data write operation, a data write current is necessarily applied to the two types of wirings. Therefore, magnetic noises are steadily applied from the two types of wirings to the non-selected memory cells located adjacent thereto. By arranging wirings other than the above two types of wirings in view of the steady noises, erroneous writing to the non-selected memory cells can be effectively prevented.

Figure 38:
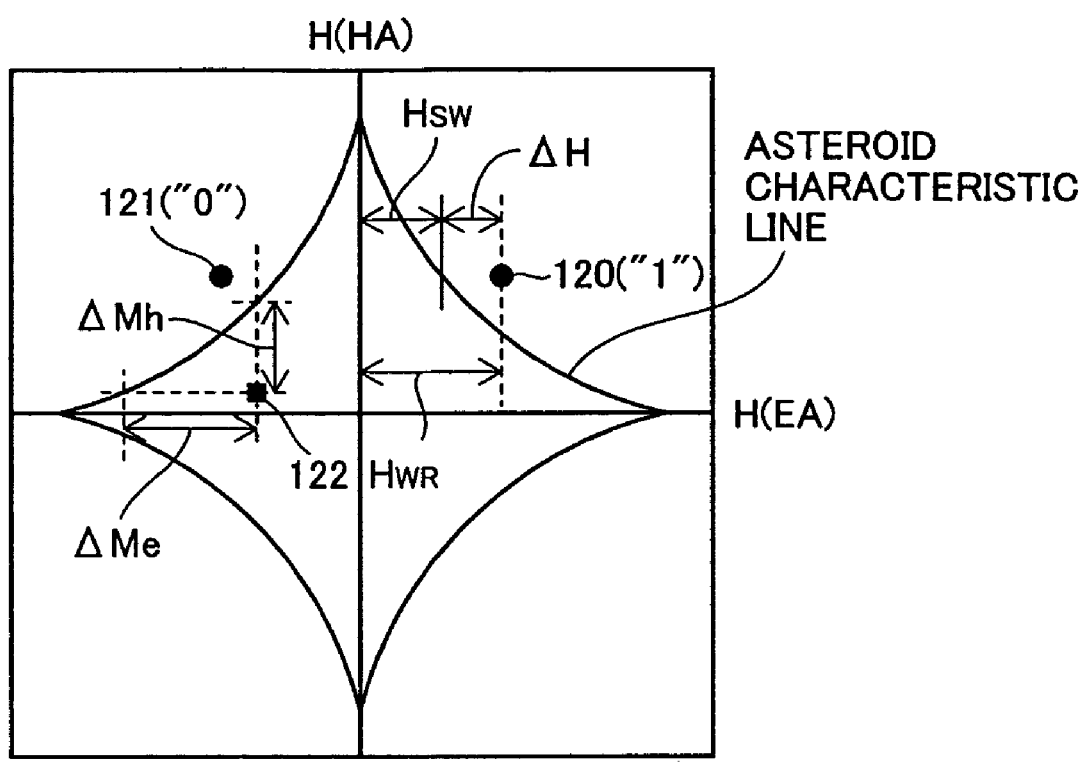
FIG. 38 is a conceptual diagram showing noises that are steadily applied to the non-selected memory cells, and illustrating the arrangement of wirings according to an eighth embodiment of the present invention.
Figure 39:
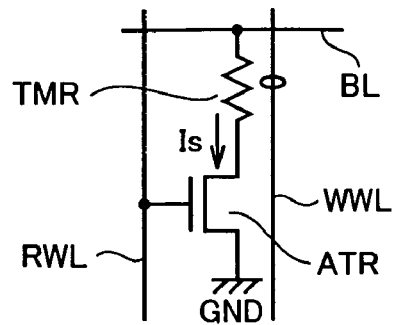
FIG. 39 schematically shows the structure of an MTJ memory cell.

FIG. 38 is a conceptual diagram illustrating the steady noises that are applied to the non-selected memory cells.

Referring to FIG. 38, in data write operation, a data write magnetic field corresponding to an operation point 120 or 121 is applied to the selected memory cell according to the write data level. Operation points 120, 121 are designed with a margin in the region outside the asteroid characteristic line described in connection with FIG. 42.

A data write current is applied to write word line WWL of the adjacent row and bit line BL of the adjacent column. Therefore, the noise corresponding to a point 122 is steadily applied to the non-selected memory cells that are most susceptible to erroneous writing. The distances between point 122 and asteroid characteristic line along the ordinate and abscissa, $\Delta Mh$ and $\Delta Me$, respectively indicate margins for erroneous writing to the non-selected memory cells along the hard-axis and easy-axis directions (hereinafter, sometimes referred to as "residual magnetic field margins").

Erroneous writing to the non-selected memory cells would occur if the non-selected memory cells are subjected to a magnetic noise of the hard-axis direction beyond residual magnetic field margin ΔMh. Similarly, erroneous writing to the non-selected memory cells would occur if the non-selected memory cells are subjected to a magnetic noise of the easy-axis direction beyond residual magnetic field margin ΔMe. The non-selected memory cells may be subjected to magnetic noises of both directions. In this case, erroneous writing may possibly occur even if each magnetic noise does not exceed residual magnetic field margin ΔMe, ΔMh. These residual magnetic field margins ΔMe, ΔMh can be used to determine the direction of the magnetic noise (easy-axis direction or hard-axis direction) to which memory cells MC are relatively vulnerable.

Of conductive wirings other than bit lines BL and write word lines WWL for applying a data write magnetic field to the memory cells, a wiring located nearest to memory cells MC (i.e., tunneling magneto-resistance elements TMR) is provided in such a direction that the magnetic noise from the nearest wiring has the same direction as that of residual magnetic field margin ΔMe or ΔMh having a greater value (hereinafter, the wiring located nearest to memory cells MC is sometimes simply referred to as "nearest wiring"). As a result, erroneous writing to the non-selected memory cells can be effectively prevented.

In particular, tunneling magneto-resistance elements TMR are designed to have an elongated shape in order to stabilize their magnetization characteristics. Therefore, bit lines BL for generating a magnetic field of the easy-axis direction are arranged at a different pitch from that of write word lines WWL for generating a magnetic field of the hard-axis direction. The relation between residual magnetic field margins ΔMh, ΔMe in FIG. 38 (i.e., which residual magnetic field margin is larger than the other) can be estimated from the above pitches. More specifically, the residual magnetic field margin corresponding to the direction of the magnetic field generated by the wirings of a smaller pitch (i.e., bit lines BL or write word lines WWL) is smaller than the other residual magnetic field margin. Accordingly, the nearest wiring is provided in the same (parallel) direction as that of the wirings of a greater pitch.

Tunneling magneto-resistance element TMR is commonly designed so that the longitudinal direction thereof matches the easy-axis direction. In this case, bit lines BL for generating a magnetic field of the easy-axis direction are arranged at a greater pitch than that of write word lines WWL for generating a magnetic field of the hard-axis direction. Accordingly, it is desirable to provide the nearest wiring parallel to bit lines BL. If the pitch relation is opposite to that described above, it is desirable to provide the nearest wiring parallel to write word lines WWL.

It is also desirable to determine the direction of wirings receiving a relatively large current (such as power supply lines) in the same manner as that of the nearest wiring.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device, comprising:
   a memory array having a plurality of memory cells for magnetic data storage arranged therein, each memory cell including a magnetic storage portion having an electric resistance varying according to a magnetization direction that is rewritable by application of a prescribed magnetic field;
   a peripheral circuitry provided in a region adjacent to said memory array, for conducting data read operation and data write operation from and to said memory array; and
   first and second power supply lines for supplying an operating voltage to said peripheral circuitry, wherein
   said first and second power supply lines are arranged so that a first magnetic field generated by a current flowing through said first power supply line and a second magnetic field generated by a current flowing through said second power supply line are applied to said memory array in an easy-axis direction of said magnetic storage portions.

2. The thin film magnetic memory device according to claim 1, wherein said first and second power supply lines are arranged so that said first and second magnetic fields cancel each other in said memory array.

3. The thin film magnetic memory device according to claim 1, wherein
   said plurality of memory cells are arranged in a matrix,
   said thin film magnetic memory device further comprising:
   a plurality of first write lines provided corresponding to one of memory cell rows and memory cell columns, for selectively receiving a data write current in order to mainly apply a magnetic field of the easy-axis direction to a selected memory cell, and
   a plurality of second write lines provided corresponding to the other of said memory cell rows and said memory cell columns, for selectively receiving a data write current in order to mainly apply a magnetic field of a hard-axis direction to the selected memory cell, wherein
   said plurality of first write lines are arranged at a greater pitch than that of said plurality of second write lines.

4. A thin film magnetic memory device, comprising:
   a memory array having a plurality of memory cells for magnetic data storage arranged in a matrix; and
   a plurality of dummy magnetic elements provided at an end of said memory array along at least one of memory cell rows and memory cell columns, and having a fixed magnetization direction.

5. The thin film magnetic memory device according to claim 4, wherein a magnetization direction of said dummy magnetic elements is determined so that a magnetic field generated by said dummy magnetic element cancels a magnetic noise applied to said memory array.

6. The thin film magnetic memory device according to claim 5, further comprising:
   a plurality of wirings, wherein
   said magnetization direction of said dummy magnetic elements is determined so as to cancel a magnetic field generated by one of said plurality of wirings located nearest to said dummy magnetic elements.

7. The thin film magnetic memory device according to claim 4, wherein
   said dummy magnetic elements have a same shape as that of said memory cell, and
   each of said memory cells and each dummy magnetic element includes a first magnetic layer having a fixed magnetization direction, and a second magnetic layer having a magnetization direction rewritable by application of a magnetic field.

8. The thin film magnetic memory device according to claim 7, wherein said first magnetic layer of each of said memory cells and each of said dummy magnetic elements and said second magnetic layer of each of said dummy magnetic elements are magnetized in a same direction.

9. The thin film magnetic memory device according to claim 4, wherein each of said memory cells includes
a first magnetic layer having a fixed magnetization direction, and
a second magnetic layer having a magnetization direction rewritable by a magnetic field applied in data write operation, and
each of said dummy magnetic elements includes a third magnetic layer fixedly magnetized in a same direction as that of said first magnetic layer.

10. A thin film magnetic memory device, comprising:

a memory array having a plurality of memory cells for magnetic data storage arranged therein, each of said memory cells including a first magnetic element;

a plurality of first wirings provided for said memory array, and each electrically connected to said first magnetic element included in at least one of said plurality of memory cells;

an inductance element including a second wiring formed in a same wiring layer as that of said plurality of first wirings in a region outside said memory array, and a second magnetic element formed in a same layer as that of said first magnetic elements in the region outside said memory array and electrically connected to said second wiring.

11. The thin film magnetic memory device according to claim 10, wherein said first and second magnetic elements have a same shape and structure.

12. The thin film magnetic memory device according to claim 10, further comprising:

a power supply line for supplying an operating voltage, wherein said inductance element is electrically coupled in series with said power supply line in order to suppress a peak current on said power supply line.

* * * * *